United States Patent
Nishikawa et al.

(10) Patent No.: US 10,410,855 B2
(45) Date of Patent: Sep. 10, 2019

(54) CLEANING METHOD, METHOD FOR MANUFACTURING SEMICONDUCTOR DEVICE, AND PLASMA TREATMENT DEVICE

(71) Applicant: SHARP KABUSHIKI KAISHA, Sakai, Osaka (JP)

(72) Inventors: Daichi Nishikawa, Sakai (JP); Takeshi Hirase, Sakai (JP); Tetsuya Okamoto, Sakai (JP); Tohru Senoo, Sakai (JP); Tohru Sonoda, Sakai (JP); Seiji Fujiwara, Sakai (JP); Mamoru Ishida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 26 days.

(21) Appl. No.: 15/559,353

(22) PCT Filed: Mar. 15, 2016

(86) PCT No.: PCT/JP2016/058153
§ 371 (c)(1),
(2) Date: Sep. 18, 2017

(87) PCT Pub. No.: WO2016/148139
PCT Pub. Date: Sep. 22, 2016

(65) Prior Publication Data
US 2018/0114690 A1    Apr. 26, 2018

(30) Foreign Application Priority Data

Mar. 19, 2015 (JP) .................................. 2015-056906

(51) Int. Cl.
*H01L 21/02* (2006.01)
*H01L 21/683* (2006.01)
(Continued)

(52) U.S. Cl.
CPC ............ *H01L 21/0206* (2013.01); *B08B 5/02* (2013.01); *B08B 7/00* (2013.01); *H01J 37/00* (2013.01);
(Continued)

(58) Field of Classification Search
None
See application file for complete search history.

(56) References Cited

FOREIGN PATENT DOCUMENTS

| JP | 2007-234236 A | 9/2007 |
|---|---|---|
| JP | 2011-208255 A | 10/2011 |

(Continued)

OTHER PUBLICATIONS

English Machine Translation of JP 2011-208255.*
(Continued)

*Primary Examiner* — Nicole Blan
(74) *Attorney, Agent, or Firm* — ScienBiziP, P.C.

(57) ABSTRACT

The present invention provides a cleaning method by which it is possible to prevent deformation of a film formation mask (31). While the film formation mask (31) disposed between a shower head (4) and a susceptor (3) within a chamber (2) is cooled, a cleaning gas made into plasma, which cleaning gas reacts with a reaction product (32) deposited on a surface of the film formation mask (31), is blown on the film formation mask (31).

5 Claims, 10 Drawing Sheets

(51) Int. Cl.
| | |
|---|---|
| *H01L 21/687* | (2006.01) |
| *B08B 5/02* | (2006.01) |
| *B08B 7/00* | (2006.01) |
| *H05H 1/46* | (2006.01) |
| *H01L 21/31* | (2006.01) |
| *H01L 21/033* | (2006.01) |
| *H01L 21/67* | (2006.01) |
| *H01L 51/52* | (2006.01) |
| *H01L 51/56* | (2006.01) |
| *H01J 37/00* | (2006.01) |
| *H01J 37/32* | (2006.01) |

(52) U.S. Cl.
CPC .. *H01J 37/32357* (2013.01); *H01J 37/32715* (2013.01); *H01J 37/32862* (2013.01); *H01L 21/02* (2013.01); *H01L 21/0332* (2013.01); *H01L 21/0337* (2013.01); *H01L 21/31* (2013.01); *H01L 21/67028* (2013.01); *H01L 21/67103* (2013.01); *H01L 21/67109* (2013.01); *H01L 21/67248* (2013.01); *H01L 21/6831* (2013.01); *H01L 21/68785* (2013.01); *H01L 51/5246* (2013.01); *H01L 51/56* (2013.01); *H01L 21/68742* (2013.01); *H05H 1/46* (2013.01)

(56) References Cited

FOREIGN PATENT DOCUMENTS

| | | | |
|---|---|---|---|
| JP | 2011208255 A | * 10/2011 | |
| JP | 2012-102341 A | 5/2012 | |
| WO | WO-2013136881 A1 | * 9/2013 | ............... G03F 1/22 |
| WO | WO-2013179804 A1 | * 12/2013 | ........... H01L 21/324 |

OTHER PUBLICATIONS

English Machine Translation of WO 2013-179804 A1.*
English Machine Translation of WO 2013-136881 A1.*
All of thin film transistor technology—construction, characteristic, from manufacturing process to next generation TFT.

* cited by examiner

FIG. 2
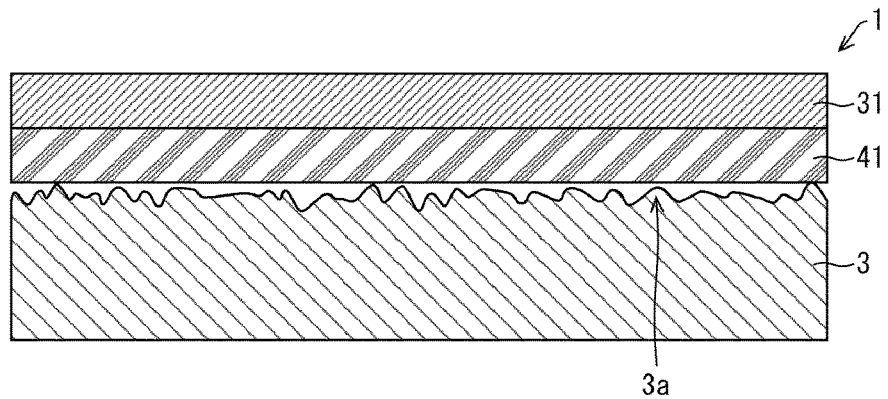
(a)
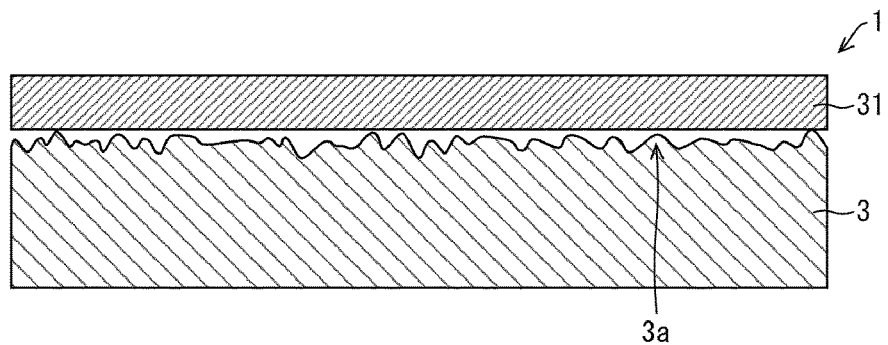
(b)
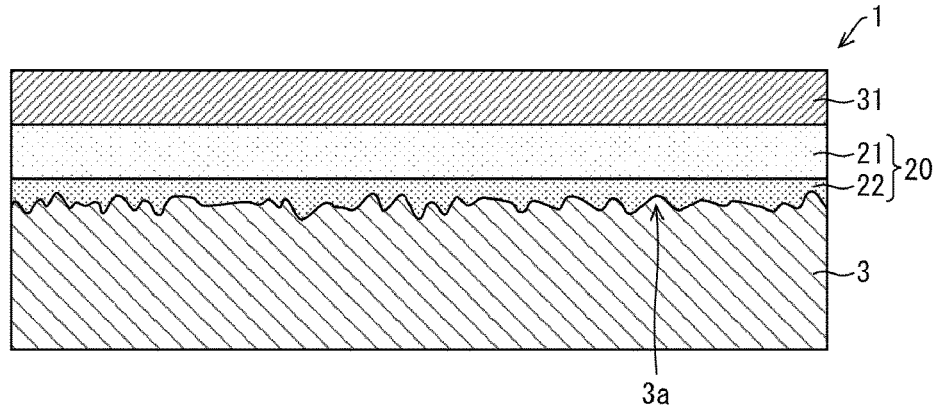
(c)

CLEANING METHOD, METHOD FOR MANUFACTURING SEMICONDUCTOR DEVICE, AND PLASMA TREATMENT DEVICE

TECHNICAL FIELD

The present invention relates to a cleaning method used for cleaning of a film formation mask, a method for manufacturing a semiconductor device by using the cleaning method, and a plasma treatment apparatus used for cleaning of a film formation mask.

BACKGROUND ART

An organic EL display device which uses electroluminescence (hereinafter abbreviated to "EL") of an organic material has attracted attention as a display device which has a higher response speed and a wider viewing angle in comparison with a liquid crystal display device.

For example, the organic EL display device is configured such that a thin film transistor (TFT) is provided on a substrate such as a glass substrate, and an organic EL element which is connected with the TFT is further provided on the substrate.

The organic EL element is a light emitting element that can emit light with high luminance by low voltage DC driving. In the organic EL element, a first electrode, an organic EL layer, and a second electrode are stacked in this order.

The organic EL layer, which is constituted by an organic compound layer including a light emitting layer, suffers property degradation by being reacted with a trace amount of moisture and oxygen. Such degradation results in loss of life to the display device. Thus, for manufacture of the organic EL display device, it is essential to form a sealing member for preventing penetration of moisture into the organic EL element.

One method of forming the sealing member is formation of a sealing film constituted by a silicon-containing film (silicon-based insulating film) which contains silicon such as silicon nitride ($Si_3N_4$) by using a chemical vapor deposition (CVD) apparatus such as a plasma CVD apparatus.

In the CVD apparatus, a film formation gas is introduced into a chamber from which air has been evacuated to generate a vacuum, and the film formation gas is then decomposed for reaction by, for example, being made into plasma between an upper electrode and a lower electrode both of which are disposed within the chamber. This forms, on a substrate disposed on the lower electrode, a film formed from a reaction product as a sealing film that covers the organic EL element.

The sealing film is formed with a pattern in any given shape for each organic EL display device by using a film formation mask so as not to cover, for example, a connection terminal between the organic EL display device and an external entity.

The reaction product is accumulated on a surface of the substrate as well as a surface of the film formation mask and others. Therefore, after the formation of the sealing film, a film formed from some portion of the reaction product which portion did not reach the substrate remains in an area of the film formation mask other than one or more openings thereof.

In view of this, after the step of forming a sealing film by use of a CVD apparatus using the film formation mask as described above, cleaning of the chamber is performed to remove the film formed from the reaction product accumulated on the area of the film formation mask other than the one or more openings thereof.

During the cleaning, exciting a cleaning gas by application of a high frequency voltage between the upper electrode and the lower electrode causes damage to the upper electrode and the lower electrode. Thus, for cleaning of the chamber, a remote plasma method is generally employed (see, for example, Non-Patent Literature 1).

In the remote plasma method, means of exciting a cleaning gas is provided outside the chamber so that the cleaning gas having been made into plasma outside the chamber is externally introduced into the chamber through the upper electrode. This causes the reaction product accumulated on the area of the film formation mask other than the one or more openings thereof to be vaporized by reaction with the cleaning gas having been made into plasma. As a result, the reaction product is removed.

As the cleaning gas, a fluorine-based gas is generally used.

CITATION LIST

Non-Patent Literature

[Non-Patent Literature 1]
Ikuhiro Ukai, "All About Thin-film Transistor Technology—From Structure, Characteristics, and Manufacturing Process to Next-generation TFT", Kogyo Chosakai Publishing Co., Ltd., Oct. 25, 2007, First Edition, First Printing, p 116-p 120

SUMMARY OF INVENTION

Technical Problem

Unfortunately, reaction of a film containing silicon such as $Si_3N_4$ with fluorine generates reaction heat. The heat thus generated has a high temperature. A failure to sufficiently dissipate the reaction heat of the film formation mask during the cleaning of the film formation mask increases a temperature of the film formation mask. This can lead to deformation (elongation) of the film formation mask due to thermal expansion.

Especially, in a case where cleaning gas exiting means is provided outside the chamber, radicals in the cleaning gas decrease while the cleaning gas is introduced into the chamber. This tends to cause a longer cleaning time and an increase in amount of usage of cleaning gas. This is more likely to cause deformation of the film formation mask.

Deformation of the film formation mask leads to change in clearance between the substrate and the film formation mask, thus causing problems such as a failure to form a film with an intended pattern.

Further, when fluorine-based plasma originating from an etching gas directly impinges on the lower electrode, the lower electrode is worn out. When a cleaning gas is blown on the film formation mask through the upper electrode, irregular etching of the lower electrode proceeds in one or more regions of the lower electrode which is/are located at a position(s) corresponding to the one or more openings of the film formation mask in a plan view (i.e., when viewed from above the film formation mask).

The present invention has been attained in view of the above problems, and an object of the present invention is to provide a cleaning method, a method for manufacturing a semiconductor device, and a plasma treatment apparatus all of which make it possible to prevent deformation of a film formation mask. Further, another object of the present invention is to provide a cleaning method, a method for manufacturing a semiconductor device, and a plasma treatment apparatus all of which make it possible to prevent deformation of a film formation mask and local wearing of a lower electrode.

Solution to Problem

In order to solve the above problems, a cleaning method in accordance with an aspect of the present invention is a cleaning method in which cleaning of a film formation mask, which is disposed between a first electrode and a second electrode within a chamber, the first electrode having a gas ejection section, the second electrode disposed so as to face the first electrode, is performed by blowing a cleaning gas made into plasma, which cleaning gas reacts with a film residue deposited on a surface of the film formation mask, on the film formation mask from the gas ejection section, the cleaning method including: performing cleaning of the film formation mask while cooling the film formation mask.

In order to solve the above problems, a method for manufacturing a semiconductor device in accordance with an aspect of the present invention includes: a film formation step of forming a film on a film formation target substrate via a film formation mask; and a cleaning step of performing cleaning of the film formation mask by a cleaning method in accordance with an aspect of the present invention.

In order to solve the above problems, a plasma treatment apparatus in accordance with an aspect of the present invention is a plasma treatment apparatus including: a chamber which accommodates a film formation mask; a first electrode, provided within the chamber, having a gas ejection section; and a second electrode, provided within the chamber, disposed so as to face the first electrode via the film formation mask, wherein a cleaning gas made into plasma, which cleaning gas reacts with a film residue deposited on a surface of the film formation mask, is ejected from the gas ejection section so that the film residue deposited on the surface of the film formation mask is made into gas and is removed, the plasma treatment apparatus including: a cooling member which cools the film formation mask during cleaning.

Advantageous Effects of Invention

An aspect of the present invention makes it possible to provide a cleaning method, a semiconductor device manufacturing method, and a plasma treatment apparatus all of which make it possible to prevent deformation of a film formation mask.

(a) of FIG. 2 is a side view illustrating a schematic configuration of a main part of the CVD apparatus in accordance with Embodiment 1 of the present invention during film formation, and (b) and (c) of FIG. 2 are side views each illustrating a schematic configuration of a main part of the CVD apparatus in accordance with Embodiment 1 of the present invention during cleaning.

Figure 3:
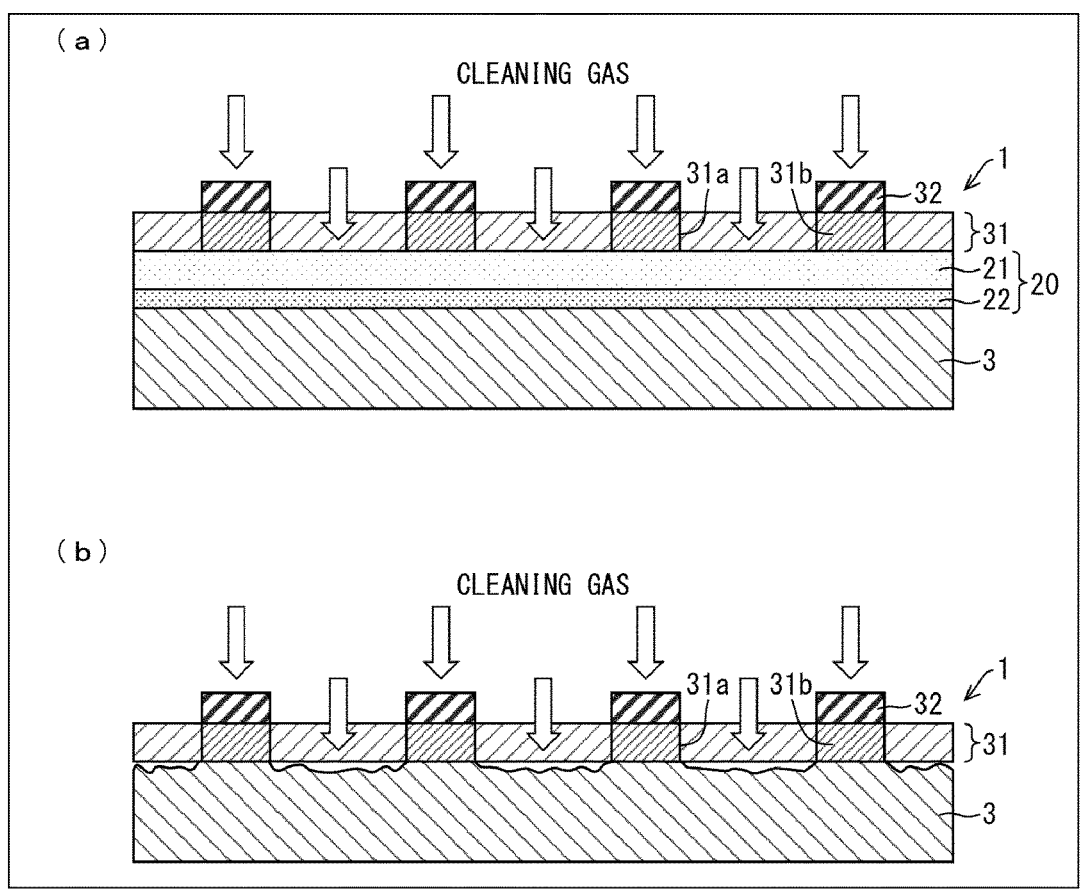

(a) and (b) of FIG. 3 are cross-sectional views each illustrating a schematic configuration of a main part of the CVD apparatus in accordance with Embodiment 1 of the present invention during cleaning.

Figure 4:
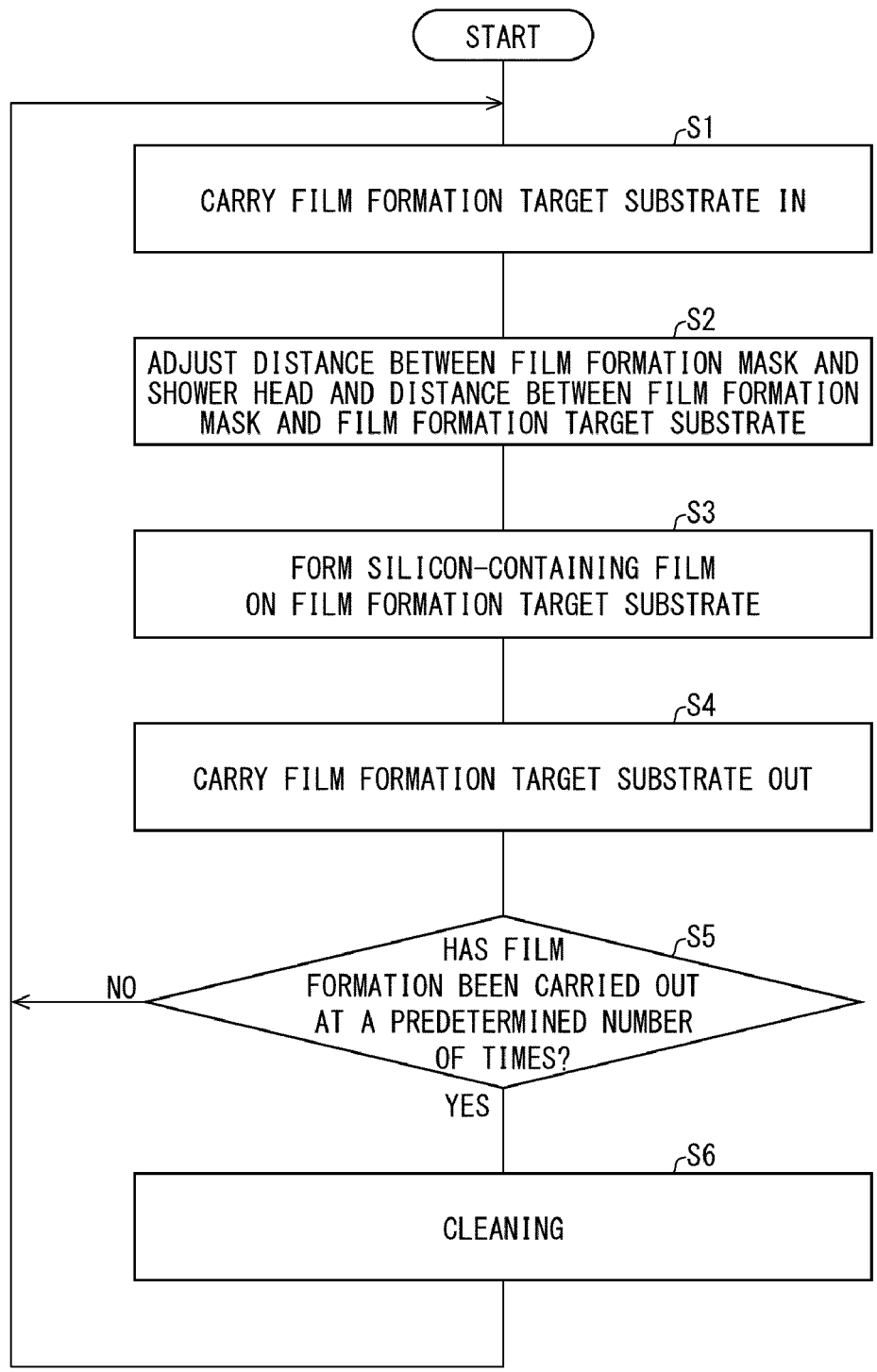

FIG. 4 is a flowchart showing sequential steps in the process for producing a silicon-containing film in accordance with Embodiment 1 of the present invention.

Figure 5:
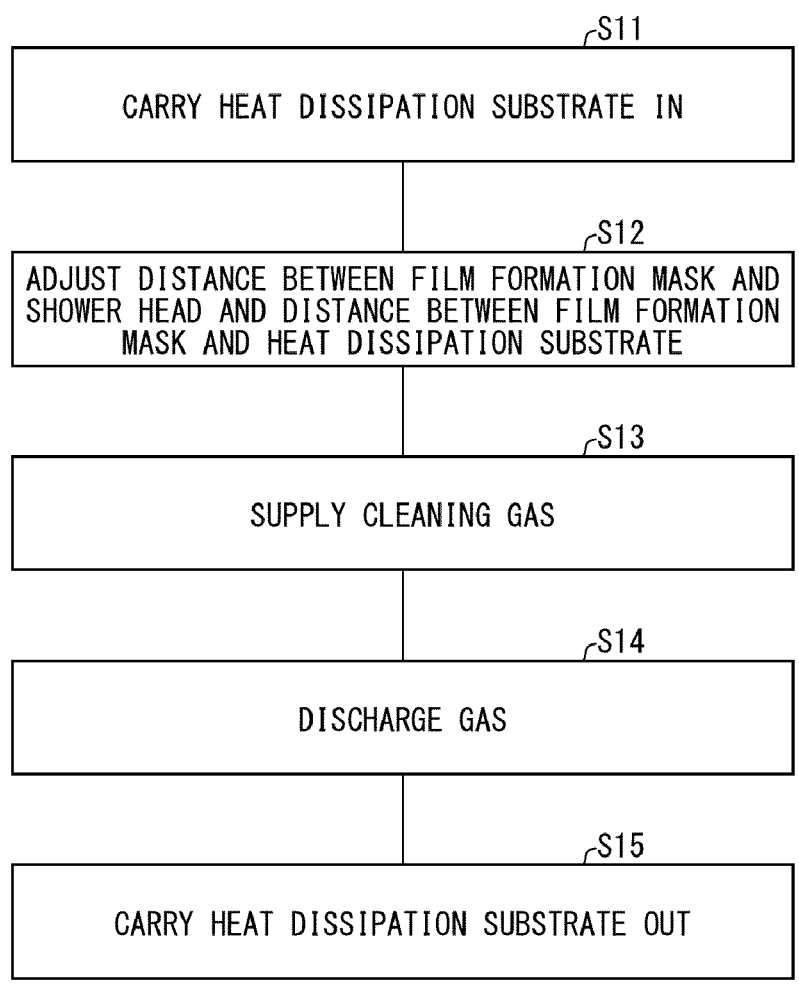

FIG. 5 is a flowchart showing the cleaning step in the process for producing a silicon-containing film in accordance with Embodiment 1 of the present invention.

Figure 6:
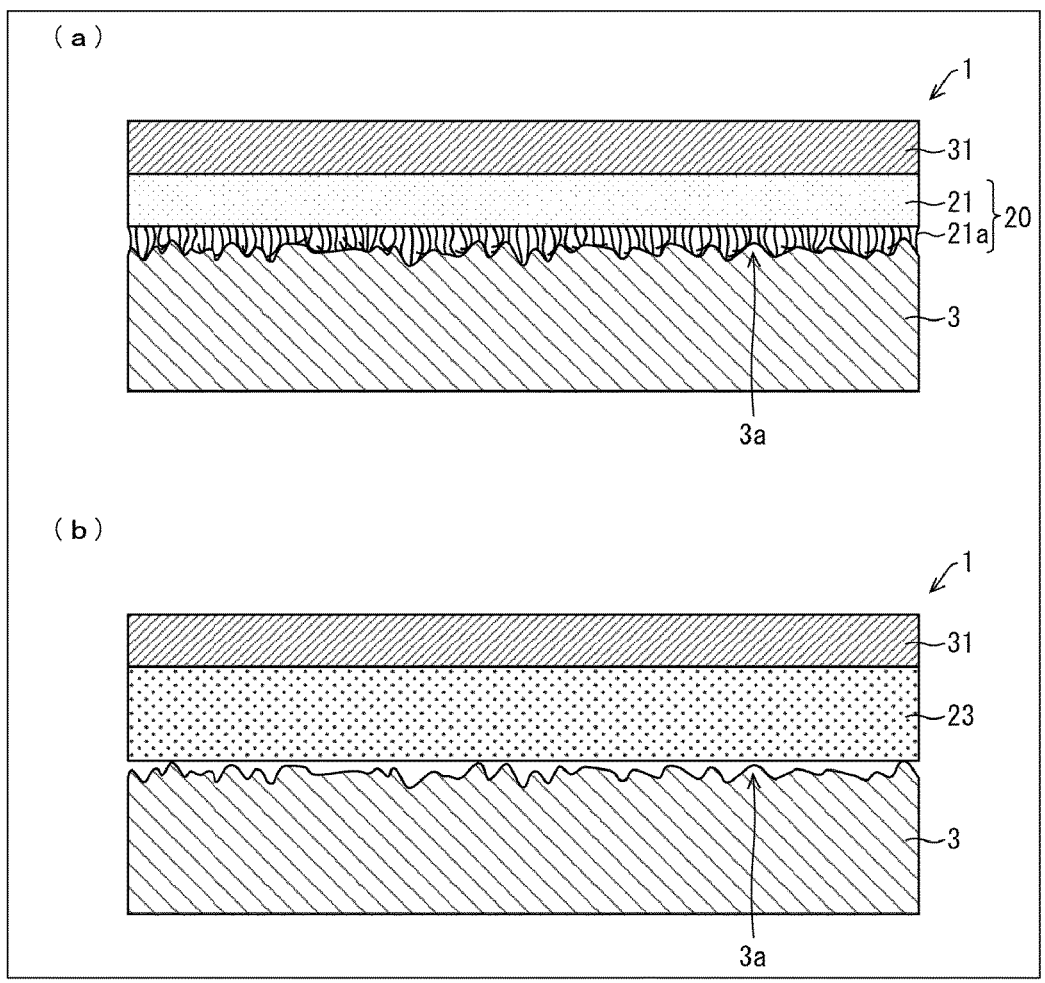

(a) and (b) of FIG. 6 are cross-sectional views respectively illustrating schematic configurations of main parts of other CVD apparatuses 1 in accordance with Embodiment 1 of the present invention.

Figure 7:
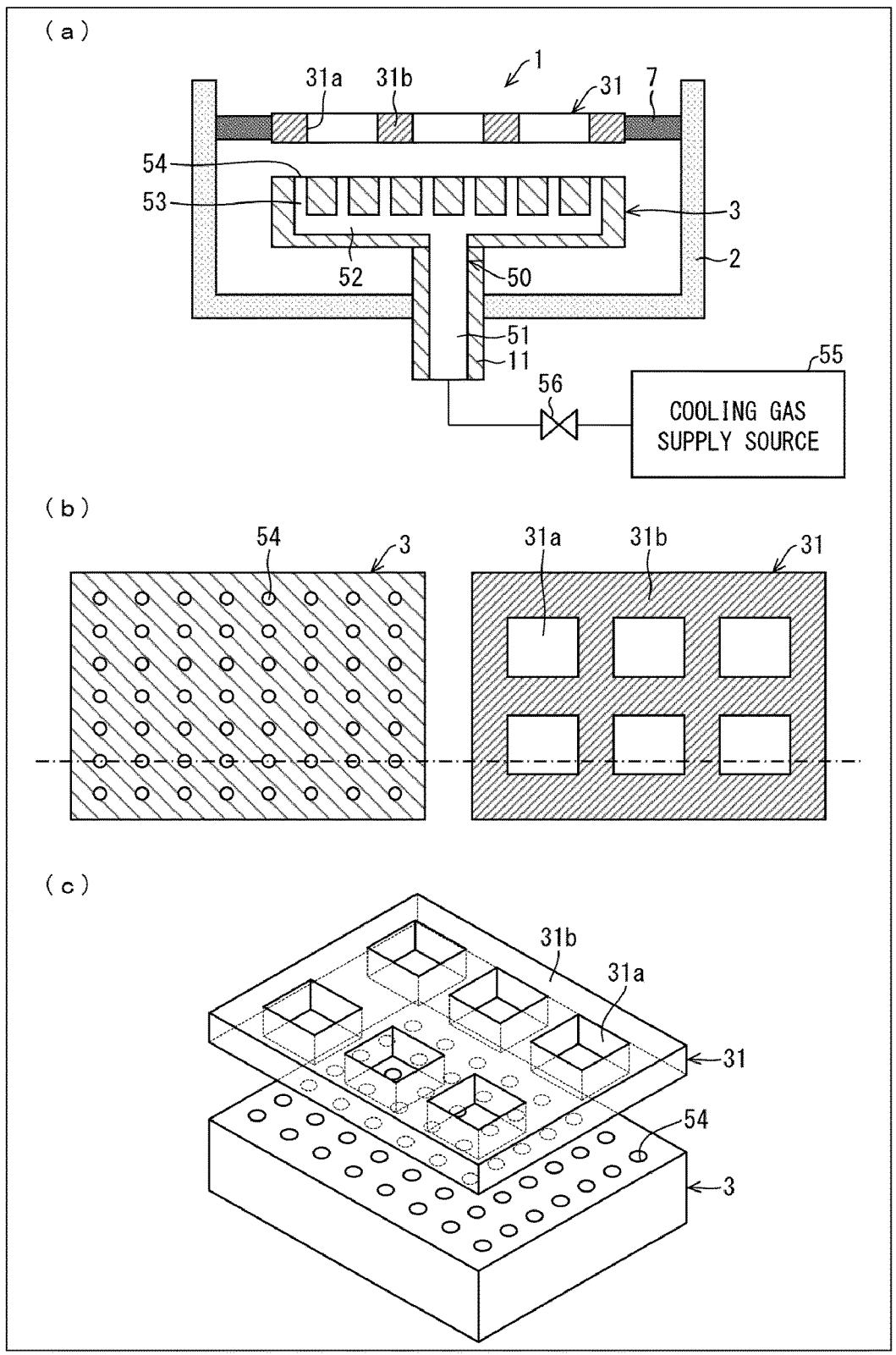

(a) of FIG. 7 is a cross-sectional view of a main part of a CVD apparatus in accordance with Embodiment 2 of the present invention, the view illustrating a susceptor and a film formation mask which are vertically juxtaposed, (b) of FIG. 7 is a plan view illustrating the susceptor and the film formation mask, both illustrated in (a) of FIG. 7, which are laterally juxtaposed, and (c) of FIG. 7 is a perspective view illustrating the susceptor and the film formation mask, both illustrated in (a) of FIG. 7, which are vertically juxtaposed.

Figure 8:
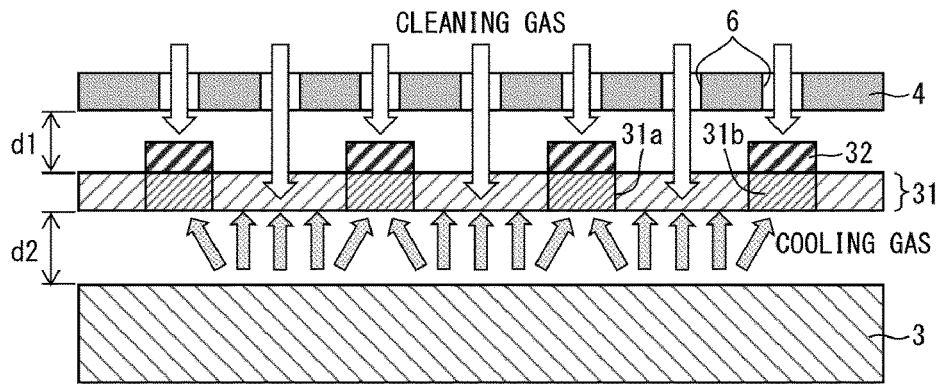

FIG. 8 is a cross-sectional view illustrating a schematic configuration of a main part of the CVD apparatus 1 in accordance with Embodiment 2 of the present invention during cleaning.

Figure 9:
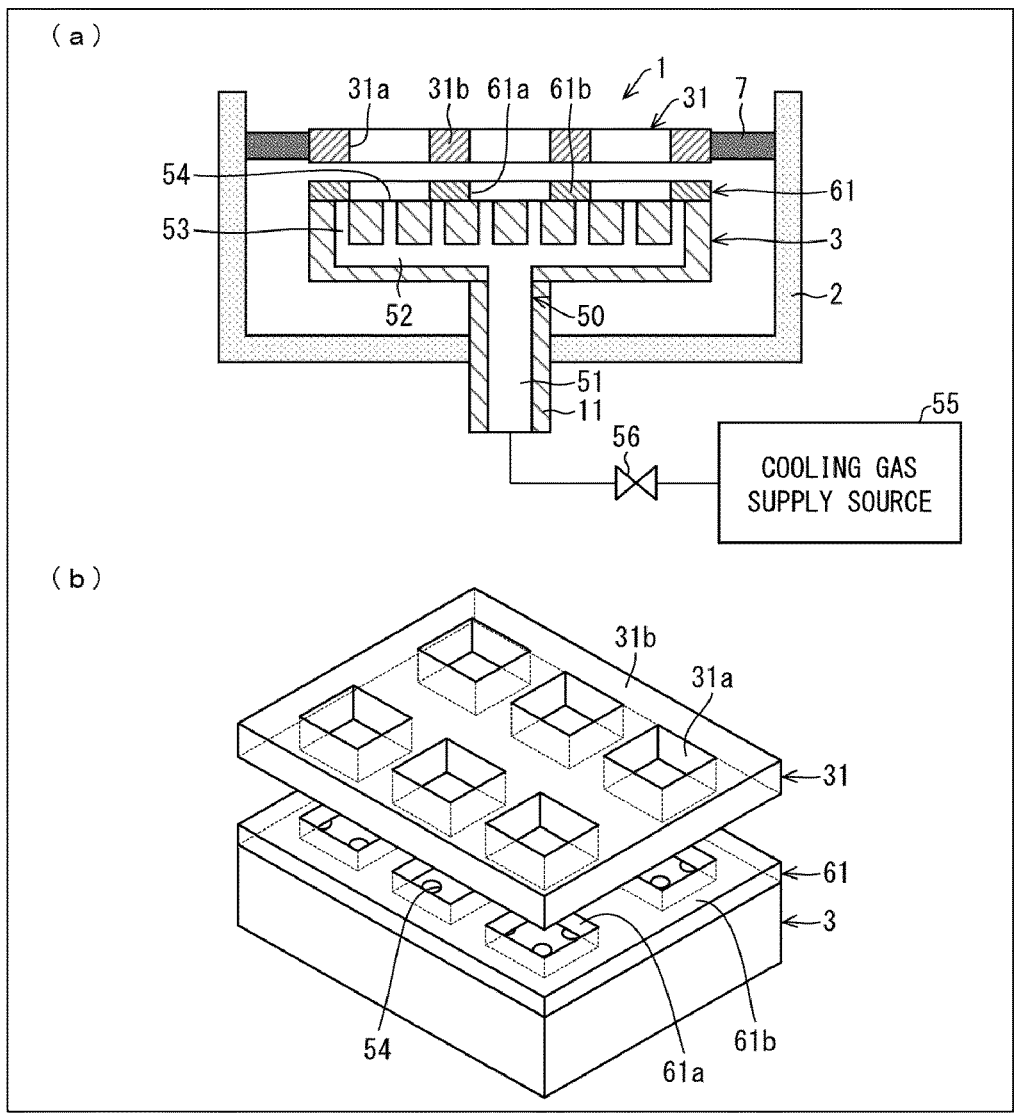

(a) of FIG. 9 is a cross-sectional view of a main part of a CVD apparatus in accordance with Embodiment 3 of the present invention, the view illustrating a susceptor, a shielding mask, and a film formation mask which are vertically juxtaposed, and (b) of FIG. 9 is a perspective view illustrating the susceptor, the shielding mask, and the film formation mask, all illustrated in (a) of FIG. 9, which are vertically juxtaposed.

Figure 10:
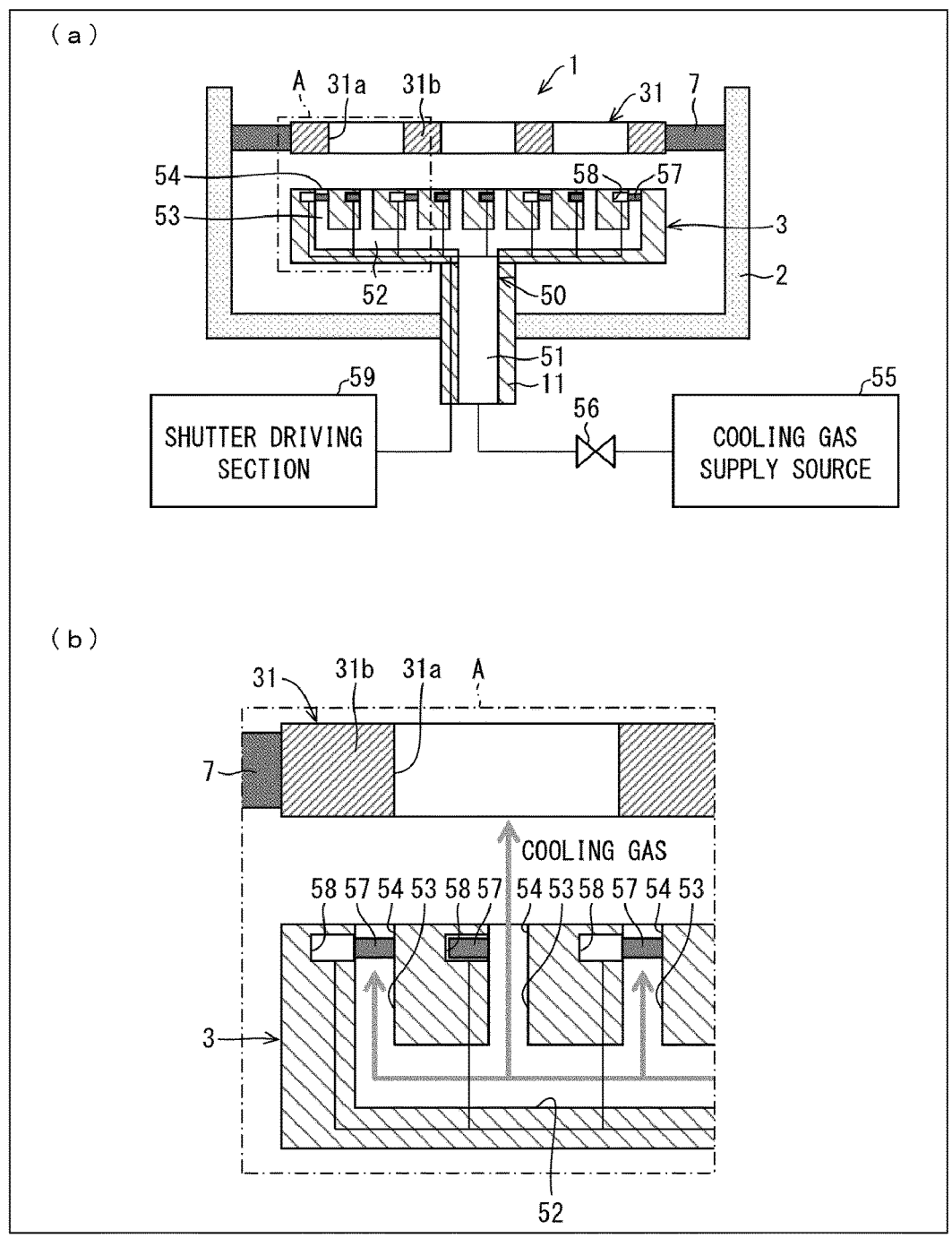

(a) of FIG. 10 is a cross-sectional view of a main part of a CVD apparatus in accordance with Embodiment 4 of the present invention, the view illustrating a susceptor and a film formation mask which are vertically juxtaposed, and (b) of FIG. 10 is a cross-sectional view illustrating a region indicated by a dot-and-dash line in (a) of FIG. 10 in an enlarged view.

Figure 11:
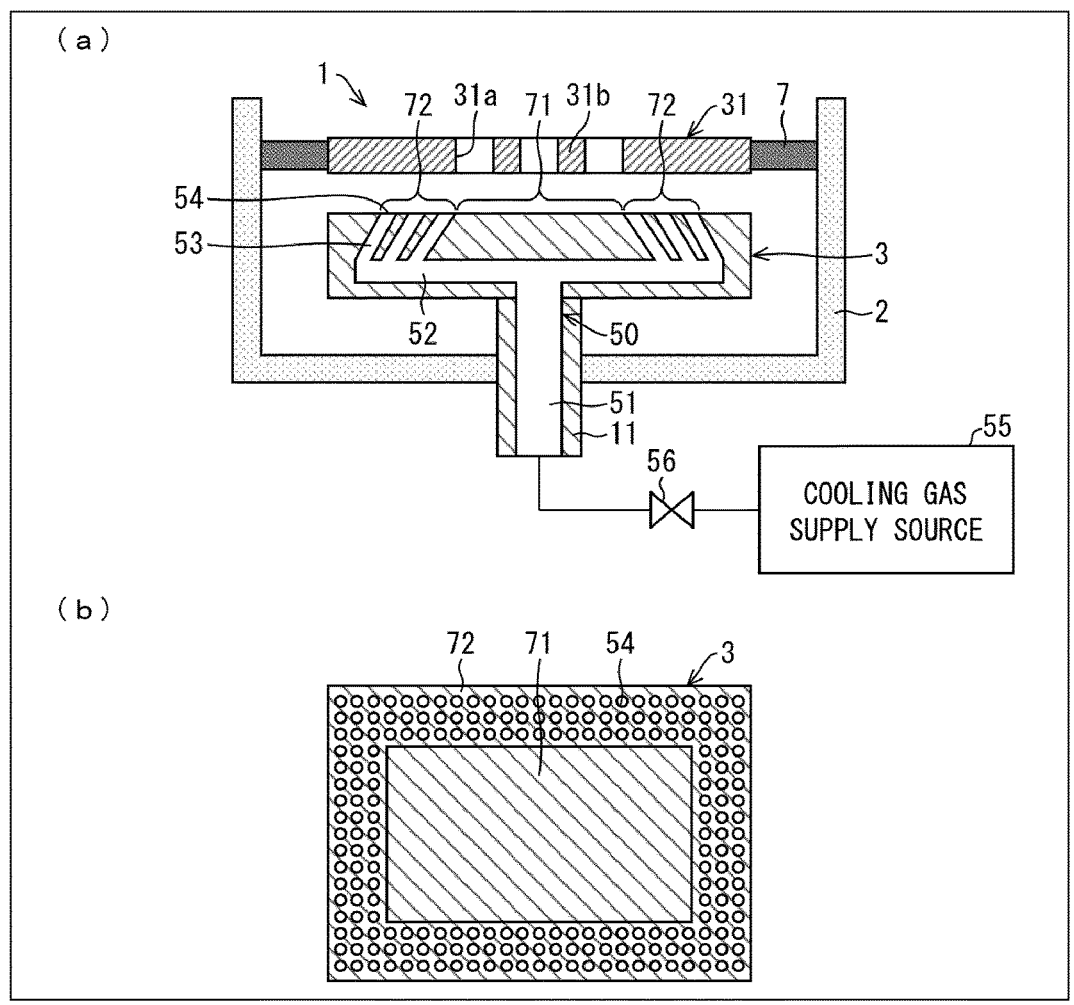

(a) of FIG. 11 is a cross-sectional view of a main part of a CVD apparatus in accordance with Embodiment 5 of the present invention, the view illustrating a susceptor and a film formation mask which are vertically juxtaposed, and (b) of FIG. 11 is a plan view schematically illustrating a configuration of the susceptor illustrated in (a) of FIG. 11.

DESCRIPTION OF EMBODIMENTS

The following will describe embodiments of the present invention in detail.

Embodiment 1

Figure 1:
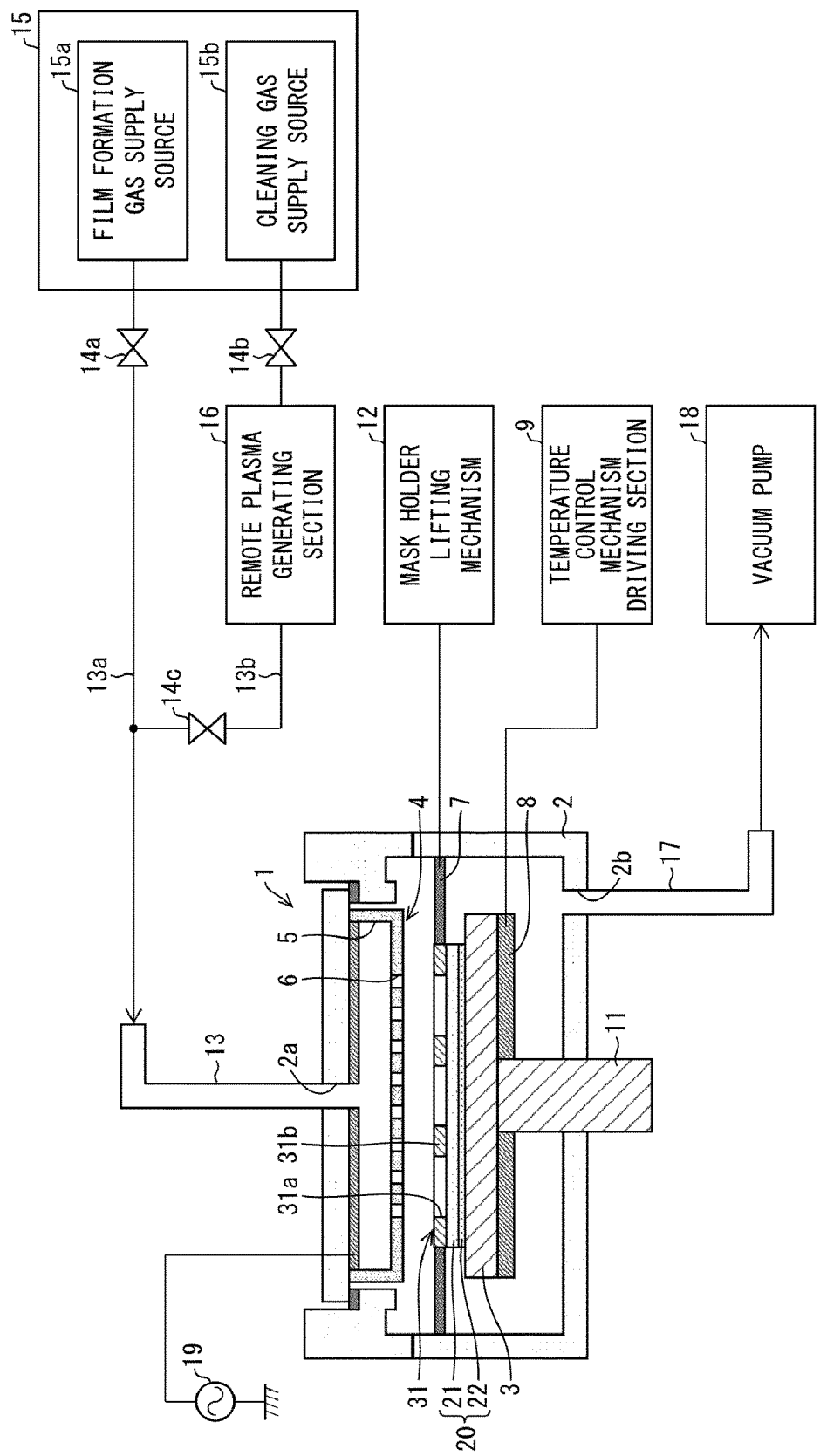
FIG. 1 is a cross-sectional view illustrating an example schematic configuration of a CVD apparatus in accordance with Embodiment 1 of the present invention.

The following will describe Embodiment 1 of the present invention with reference to FIG. 1 to (a) and (b) of FIG. 6.

The following description in Embodiment 1 will discuss an example case in which a CVD apparatus (plasma treatment apparatus) in accordance with Embodiment 1 is a plasma CVD apparatus used in a film formation process employing a plasma CVD method, and film formation using a mask and cleaning of the mask used in the film formation are carried out in one and the same CVD apparatus.

<Schematic Configuration of CVD Apparatus>

FIG. 1 is a cross-sectional view illustrating an example schematic configuration of a CVD apparatus 1 in accordance with Embodiment 1.

(a) of FIG. 2 is a side view illustrating a schematic configuration of a main part of the CVD apparatus 1 during film formation, and (b) and (c) of FIG. 2 are side views each illustrating a schematic configuration of a main part of the CVD apparatus 1 during cleaning. (a) and (b) of FIG. 3 are cross-sectional views each illustrating a schematic configuration of a main part of the CVD apparatus 1 during cleaning. Note that (a) and (b) of FIG. 3 illustrate a difference in wearing state of a susceptor 3 during cleaning between with and without a heat dissipation substrate 20.

As illustrated in FIG. 1, the CVD apparatus 1 in accordance with Embodiment 1 includes a chamber 2, a susceptor 3, a shower head 4, a mask holder 7, a temperature control mechanism 8, a temperature control mechanism driving section 9, a susceptor lifting mechanism 11, a mask holder lifting mechanism 12, a gas supply pipe 13, a gas supply source 15, a remote plasma generating section 16, an exhaust pipe 17, a vacuum pump 18, a high frequency power source 19, and a heat dissipation substrate 20.

The chamber 2 serves both as a film formation room and as a cleaning room. The chamber 2 has, in its upper part (e.g., a ceiling wall), a gas supply port 2a through which a film formation gas and a cleaning gas are supplied.

The chamber 2 further has an exhaust port 2b in its bottom wall or side wall. The exhaust port 2b is connected via the exhaust pipe 17 to the vacuum pump 18 which is provided outside the chamber 2. This allows the chamber 2 to be maintained under vacuum. Further, unnecessary gas present in the chamber 2 after film formation or after completion of cleaning is discharged out of the chamber 2 through the exhaust port 2b via the exhaust pipe 17 and the vacuum pump 18.

Further, the chamber 2 is provided with a temperature control mechanism (chamber temperature control mechanism) (not illustrated) such as a heat exchanger and is controlled so that a temperature of the chamber reaches a desired temperature.

Inside the chamber 2 are provided the susceptor 3, the shower head 4, and the mask holder 7, and the temperature control mechanism 8.

The susceptor 3 is provided so as to face the shower head 4 via the film formation mask 31 which is held by the mask holder 7. The susceptor 3, into which an electric conductor (not illustrated) is embedded, functions as a lower electrode (second electrode).

The susceptor 3 is a substrate holding member. As illustrated in (a) of FIG. 2, when a film is to be formed on a substrate 41, the substrate 41 is mounted on the susceptor 3, which holds the substrate 41 in a state in which the substrate 41 is heated to a fixed temperature.

Note that the susceptor 3 can include an electrostatic chuck mechanism (not illustrated) so that the substrate 41 is adapted to be attracted and fixed by an electrostatic chuck.

As illustrated in FIG. 1, the temperature control mechanism 8 such as a heat exchanger is attached to the susceptor 3. The temperature control mechanism 8 serves as a temperature control mechanism (lower electrode temperature control mechanism) which controls (adjusts) a temperature of the susceptor 3. For example, as the temperature control mechanism 8, a path for passing a heat exchange medium such as water (hot water or cold water) through it (e.g., a liquid passing pipe) is welded on a back surface of the lower electrode.

The temperature control mechanism 8 is driven under control of the temperature control mechanism driving section 9, which is provided outside the chamber 2. The temperature control mechanism driving section 9 includes a pump and a temperature regulator (both of which are not illustrated). The temperature control mechanism driving section 9 performs heat exchange by circulating the heat exchange medium through the path, so that the temperature of the susceptor 3 is adjusted.

In Embodiment 1, in the step of forming a film on the substrate 41, the temperature control mechanism 8 is used as a heating member which heats the substrate 41 by circulating, for example, hot water. Meanwhile, in the cleaning step after the film formation, the temperature control mechanism 8 is used as a cooling member which cools the film formation mask 31 via the susceptor 3 by circulating, for example, cold water.

Note that FIG. 1 illustrates, as an example, a case in which the temperature control mechanism 8 is provided on the back surface of the susceptor 3. However, Embodiment 1 is not limited as such. For example, the temperature control mechanism 8 can alternatively be embedded in the susceptor 3.

The shower head 4, which serves as an upper electrode (first electrode), is provided above the susceptor 3 and the film formation mask 31 so as to be parallel to the susceptor 3 and the film formation mask 31.

The shower head 4 includes a gas diffusion room 5 (gas ejection section) coupled to the gas supply port 2a, which is provided in the upper part of the chamber 2. Further, the gas diffusion room 5 has a plurality of gas ejection holes 6 (through holes) on its surface which faces the film formation mask 31 and the susceptor 3.

Gas having been introduced into the gas diffusion room 5 through the gas supply port 2a passes through the gas ejection holes 6 and is ejected in the form of a shower from above the film formation mask 31.

The shower head 4 is connected to a high frequency power source 19. The high frequency power source 19 applies a high frequency voltage to the shower head 4.

Meanwhile, the susceptor 3 is grounded, or a voltage (e.g., 0 V) having a frequency lower than a frequency of the high-frequency voltage applied to the shower head 4 is applied to the susceptor 3. Thus, upon application of a high frequency voltage to the shower head 4 by the high frequency power source 19, the shower head 4 performs high frequency discharge, so that a high frequency electric field is formed between the shower head 4 and the susceptor 3. This excites plasma. The susceptor 3 and the shower head 4 function as high frequency electrodes for plasma formation.

The CVD apparatus 1, at the time of film formation, allows a film formation gas to be reacted by being decomposed by plasma which has been excited by high frequency discharge, so that a film derived from a source material gas which is contained in the film formation gas is formed as a reaction product 32 (see (a) and (b) of FIG. 3) on the substrate 41.

The mask holder 7 which holds the film formation mask 31 is provided between the susceptor 3 and the shower head 4.

Further, the mask holder 7 is provided with the mask holder lifting mechanism 12 which lifts up and down the mask holder 7.

The susceptor 3 is provided with the susceptor lifting mechanism 11 (lower electrode lifting mechanism) which lifts up and down the susceptor 3.

This allows a distance between the shower head 4 and the film formation mask 31 and a distance between the film formation mask 31 and the susceptor 3 to be adjusted to desired distances.

As the mask holder lifting mechanism 12 and the susceptor lifting mechanism 11, any of various publicly known lifting mechanisms, such as an actuator and a slider, can be used.

The gas supply port 2a is connected to a gas supply pipe 13. The gas supply pipe 13 is connected to a gas supply source 15 which supplies a film formation gas and a cleaning gas.

The gas supply pipe 13 is branched into a film formation gas supply path 13a (film formation gas supplying section) and a cleaning gas supply path 13b (cleaning gas supplying section).

The gas supply source 15 includes a film formation gas supply source 15a and a cleaning gas supply source 15b.

The film formation gas supply path 13a is connected to the film formation gas supply source 15a. The cleaning gas supply path 13b is connected to the cleaning gas supply source 15b via the remote plasma generating section 16.

On the film formation gas supply path 13a, an open/close valve 14a is provided to control opening and closing of the film formation gas supply path 13a. On the cleaning gas supply path 13b, open/close valves 14b and 14c are provided to control opening and closing of the cleaning gas supply path 13b.

The open/close valves 14a to 14c function as a gas switching section which performs switching of gas to be supplied into the chamber 2. Specifically, the open/close valve 14a controls supply of gas from the film formation gas supply source 15a to the gas supply port 2a. Meanwhile, the open/close valve 14b controls supply of gas from the cleaning gas supply source 15b to the remote plasma generating section 16, and the open/close valve 14c controls supply of gas from the remote plasma generating section 16 to the gas supply port 2a. Note that only either one of the open/close valves 14b and 14c can be provided.

Examples of the open/close valves 14a to 14c include, but are not particularly limited to, electromagnetic valves. In this case, the open/close valves 14a to 14c switch between opening and closing of their corresponding supply paths of the gas supply pipe 13 by operating a valve body through the use of a magnetic force of an electromagnet (solenoid) in accordance with a control signal from a control section (not illustrated).

Note that FIG. 1 illustrates an example case where the gas supply pipe 13 is branched into the film formation gas supply path 13a and the cleaning gas supply path 13b. However, Embodiment 1 is not limited as such. Alternatively, the CVD apparatus 1 can be configured such that independent gas supply pipes corresponding to the film formation gas supply path 13a and the cleaning gas supply path 13b are provided so as to be coupled to different gas supply ports.

Examples of a film formed by the CVD apparatus 1 in accordance with Embodiment 1 include a film (silicon-containing film) made up of a silicon-based compound (silicon-containing compound) such as silicon nitride ($Si_3N_4$).

As such, examples of the source material gas in the film formation gas include $SiH_4$ gas and $Si_2H_6$.

As the film formation gas, a process gas containing, for example, (i) the source material gas and (ii) an auxiliary gas for generating plasma is used.

For example, nitrogen plasma is generated by supplying $NH_3$ (ammonia) gas and $N_2$ (nitrogen) gas between the susceptor 3 and the shower head 4 and forming a high frequency electric field between the susceptor 3 and the shower head 4. Nitrogen radicals in the nitrogen plasma react with the source material gas such as $SiH_4$ to form a silicon-containing film which contains silicon such as $Si_3N_4$ on the substrate 41.

The substrate 41 which serves as a film formation target substrate is, for example, a substrate on which organic EL element and others are formed. Examples of the silicon-containing film include a sealing film, constituted by a silicon-based insulating film, for preventing penetration of moisture into the organic EL element.

However, Embodiment 1 is not limited as such. Further, the silicon-containing film is not limited to an inorganic film, and can alternatively be an organic film. The film formation gas can be changed as appropriate depending on the type of a target film to be formed.

The film formation gas supply source 15a can be a gas cylinder which accommodates the film formation gas or can be a gas generator which generates the film formation gas.

The film formation gas supply source 15a can be a gas cylinder which accommodates the cleaning gas or can be a gas generator which generates the cleaning gas.

The cleaning gas is a gas for removing, by etching, an unnecessary portion (film residue) of the reaction product 32 deposited on an object (the film formation mask 31, in particular) other than the substrate 41, which serves as a film formation target substrate, under the film formation gas within the chamber 2.

As the cleaning gas is used a reactive gas (plasma etching gas) that can etch the unnecessary portion of the reaction product 32 as the film residue by being excited by plasma discharge. As the reactive gas is used a fluorine-based gas that can react with a silicon-based compound to etch the silicon-based compound. Examples of the fluorine-based gas include a gas containing a fluorine-based compound (fluorine-containing compound) such as $NF_3$ (nitrogen trifluoride).

Note that other gas can be mixed into the cleaning gas as appropriate, provided that the other gas does not impair the advantageous effect of the present invention. For example, like an inert gas, a gas which does not substantially react with fluorine under plasma can be mixed as a carrier gas into the cleaning gas.

The flow rates of the film formation gas and the cleaning gas supplied into the chamber 2 can be set as appropriate according to the type and composition of a gas supplied into the chamber 2, a pressure inside the chamber 2, and other factors, and are not limited to specific flow rates.

The film formation gas is emitted from the film formation gas supply source 15a, passes through the film formation gas supply path 13a of the gas supply pipe 13, is supplied through the gas supply port 2a to the gas diffusion room 5 in the shower head 4, and is then ejected through the gas ejection holes 6.

Meanwhile, the cleaning gas is emitted from the cleaning gas supply source 15b, passes through the remote plasma generating section 16 provided on the cleaning gas supply path 13b of the gas supply pipe 13, is supplied through the gas supply port 2a to the gas diffusion room 5 in the shower head 4, and is then ejected through the gas ejection holes 6.

The remote plasma generating section 16 makes a cleaning gas supplied from the cleaning gas supply source 15b into plasma to decompose the cleaning gas into ions or radicals, and then supplies the cleaning gas made into plasma into the chamber 2.

Note that a scheme of plasma generation in the remote plasma generating section 16 is not limited to a specific scheme. As the remote plasma generating section 16 is used, for example, an inductive coupling-type remote plasma generating mechanism or the like.

According to Embodiment 1, a case where a cleaning gas made into plasma by using a remote plasma scheme as described above is supplied into the chamber 2 lessens damage to the susceptor 3 and the shower head 4 in comparison with a case where plasma is generated between the susceptor 3 and the shower head 4.

The heat dissipation substrate 20, which is provided attachably and detachably, is installed between the susceptor 3 and the film formation mask 31 at the time of cleaning.

The heat dissipation substrate 20 functions as a coolant (cooling member) which cools the film formation mask 31 during the cleaning. During the cleaning, the susceptor 3 functions as a cooling member which cools the heat dissipation substrate 20.

The reaction product 32 derived from the film formation gas is accumulated not only on a surface of the substrate 41 but also on a surface of the film formation mask 31 and others. Thus, after the film formation step, a film constituted by a portion of the reaction product 32 which portion has not reached the substrate 41 as illustrated in (a) and (b) of FIG. 3 is deposited (accumulated) as a deposit (film residue) in regions other than one or more openings 31a of the film formation mask 31.

Thus, as described earlier, after the film formation step performed by the CVD apparatus 1 using the film formation mask 31, the cleaning step through the use of a cleaning gas made into plasma is performed to remove the reaction product 32 deposited on the surface of the film formation mask 31.

Unfortunately, reaction between a silicon-containing film which contains, for example, $Si_3N_4$ and fluorine generates reaction heat. The heat thus generated has a high temperature.

In view of this, Embodiment 1 performs cleaning of the film formation mask 31 while cooling the film formation mask 31.

On the susceptor 3, the temperature control mechanism 8 is provided for temperature control (heating) during the film formation. In Embodiment 1, the susceptor 3 is cooled by the temperature control mechanism 8, so that the temperature of the film formation mask 31 is decreased by using the susceptor 3.

Note that, as illustrated in (b) of FIG. 2, the film formation mask 31 is capable of being cooled by being brought into direct contact with the susceptor 3. Such an embodiment is also one of the embodiments in Embodiment 1.

Meanwhile, as illustrated in (a) to (c) of FIG. 2, the surface of the susceptor 3 has a low flatness and has microscopic irregularities 3a of the order of nanometers (nm) or of the order of micrometers (μm).

Thus, depending on the degree of flatness of the surface of the susceptor 3 and the degree of heat generation, an area in which the film formation mask 31 and the susceptor 3 are in contact with each other cannot be obtained sufficiently. This may result in insufficient heat dissipation.

It is possible to increase the flatness of the susceptor 3. However, an increased flatness of the susceptor 3 may cause slippage of the substrate 41 placed on the susceptor 3 during the film formation. Therefore, it is difficult to increase the flatness of the susceptor 3.

Moreover, since the susceptor 3 is generally a consumable item, a cost increase associated with flattening or the like is not expedient from a production viewpoint.

As illustrated in (b) of FIG. 3, in a case where the susceptor 3 cooled by the temperature control mechanism 8 is used as a cooling member (coolant) which cools the film formation mask 31, and is brought into direct contact with the film formation mask 31, cleaning gas made into plasma directly contacts the susceptor 3 in one or more regions located at a position(s) corresponding to the one or more openings 31a of the film formation mask 31 in a plan view. Thus, the susceptor 3 is locally worn out by fluorine-based plasma in the cleaning gas made into plasma.

This means that even if the susceptor 3 has an increased flatness, the susceptor 3 in direct contact with the film formation mask 31 is etched and distorted. It is therefore impossible to maintain such an increased flatness of the susceptor 3 over a long term.

Further, since the susceptor 3 is locally worn out, a difference occurs in degree of progress of wearing of the susceptor 3 between the one or more regions located at the position(s) corresponding to the one or more openings 31a of the film formation mask 31 and the other region(s) (region(s) covered by the film formation mask 31; non-opening region(s) 31b) in a plan view.

Such a difference thus leads to variations between adhesion between the susceptor 3 and the above film formation mask 31 and adhesion between the susceptor 3 and another film formation mask 31, whose opening pattern is different from that of the above film formation mask 31, as placed on the susceptor 3.

The film formation mask 31 has the openings 31a corresponding to a pattern of a film to be formed on the substrate 41. In general, a CVD apparatus produces different types of devices. As such, in the CVD apparatus 1 in accordance with Embodiment 1, the pattern of the film to be formed on the substrate 41 varies depending on the type of device to be produced, and the film formation mask 31 with a different opening pattern is used for each type of the substrate 41. The use of these different film formation masks 31 leads to a smaller area in which the susceptor 3 and the film formation mask 31 are in contact with each other.

Further, a possible method for cooling the film formation mask 31 is a method of directly cooling the film formation mask 31 itself. A possible example of such a method is a method in which water cooling is carried out by using a path which is provided, for example, inside the film formation mask 31 to pass, for example, cold water (cooling water) as a cooling medium through it.

In Embodiment 1, such a method is not denied and can also be one of embodiments in Embodiment 1.

However, a small thickness is required of the film formation mask 31. A large thickness of the film formation mask 31 leads to an insufficient gas supply to end portions of the openings 31a, and thus causes a formed film to have a small thickness in regions corresponding to the end portions of the openings 31a. This may consequently deteriorate sealing performance in the regions corresponding to the end portions of the openings 31a. For example, an ultrathin part of the existing film formation mask has a thickness on the order of 20 μm.

Thus, it is difficult to leave a space in the film formation mask 31 to allow cold water to pass through it, and it is difficult to apply, for example, processing for allowing cold water to pass to the inside of the film formation mask 31.

Even if the above method is employed, the susceptor 3 may still be locally worn out by fluorine-based plasma having passed through the openings 31a of the film formation mask 31.

In view of this, in Embodiment 1, as illustrated in FIG. 1 and (c) of FIG. 2, the heat dissipation substrate 20 is inserted between the susceptor 3 and the film formation mask 31 and brought into close contact with the susceptor 3 and the film formation mask 31 at the time of cleaning. This subjects the film formation mask 31 to heat dissipation.

The heat dissipation substrate 20 has a laminated structure formed by laminating a thermally conductive substrate 21 and a thermally conductive sheet 22 which are each made of a material having thermal conductivity.

The heat dissipation substrate 20 is installed between the susceptor 3 and the film formation mask 31 such that the thermally conductive sheet 22 is a contact surface that contacts the susceptor 3.

As the thermally conductive substrate 21, a substrate made of a highly thermally conductive material such as an aluminum alloy or ceramic alloy is used suitably.

The thermally conductive sheet 22, which is composed of a highly thermally conductive material, is also called a heat dissipation sheet. As the thermally conductive sheet 22, a heat dissipation sheet constituted by a nanosheet having a thickness on the order of nanometers which accommodate the irregularities 3a of the surface of the susceptor 3 is used suitably.

As the nanosheet, a nanosheet made of a highly thermally conductive material including, for example, gold, platinum, aluminum alloy, and ceramic alloy can be used.

<Effects>

Since the thermally conductive sheet 22 is in a sheet form, the thermally conductive sheet 22 virtually surface-contacts the susceptor 3 even through the susceptor 3 has the irregularities 3a on its surface. Especially, the nanosheet has flexibility and conforms to the shape of the surface of the susceptor 3. Thus, the nanosheet smooths out the irregularities 3a of the surface of the susceptor 3 (that is, the nanosheet fills gaps). Therefore, an increase in area in which the heat dissipation substrate 20 and the susceptor 3 are in contact with each other can be expected.

Heat flow of a plate is generally expressed by the following equations.

$$q = \lambda \times (T_H - T_L)/L$$

$$Q = q \times S$$

In the equations, q represents the amount of heat per unit area of the plate, $\lambda$ represents a thermal conductivity of the plate, $T_H$ represents a temperature of a high temperature portion of the plate, $T_L$ represents a temperature of the low temperature portion of the plate, S represents an area of the plate, L represents a thickness of the plate, and Q represents the amount of heat of the entire plate.

The above equations show that an increase in area in which the plate contacts increases transfer of heat. As is clear from this, placing the heat dissipation substrate 20 having the thermally conductive sheet 22 between the heat dissipation substrate 20 and the susceptor 3 such that the heat dissipation substrate 20 is in contact with the film formation mask 31 and the susceptor 3 allows heat conducted from the film formation mask 31 to the thermally conductive substrate 21 to be efficiently conducted to the susceptor 3 via thermally conductive sheet 22. Therefore, according to the configurations illustrated in FIG. 1 and (c) of FIG. 2 enable enhancement of the effect of cooling the film formation mask 31.

Meanwhile, the susceptor 3 is maintained at a fixed temperature by, for example, circulating water. Thus, the configurations illustrated in FIG. 1 and (c) of FIG. 2 enable a decrease in temperature of the film formation mask 31 without increasing the temperature of the susceptor 3. This makes it possible to prevent deformation of the film formation mask 31.

Further, according to the configurations illustrated in FIG. 1 and (c) of FIG. 2, the heat dissipation substrate 20 is placed between the susceptor 3 and the film formation mask 31 at the time of cleaning. This eliminates exposure of the susceptor 3 to fluorine-based gas plasma, as illustrated in (a) of FIG. 3. Therefore, it is also possible to prevent the susceptor 3 from being locally worn out.

Moreover, since the susceptor 3 is originally connected to the outside, using the susceptor 3 to cool the film formation mask 31 eliminates the need to newly provide, for example, wiring and piping for cooling the film formation mask 31.

Thus, according to Embodiment 1, the heat dissipation substrate 20 simply configured without the need for, for example, wiring and piping only needs to be inserted between the susceptor 3 and the film formation mask 31 at the time of cleaning. According to Embodiment 1, it is thus possible to easily carry and arrange the heat dissipation substrate 20 from outside automatically by means of, for example, a transfer robot or the like. Therefore, the configuration in Embodiment 1 has an advantage in terms of facilitating introduction of automation.

Note that as the transfer robot, a robot for substrate transfer can be used. Consequently, Embodiment 1 achieves, at low cost, prevention of deformation of a film formation mask and prevention of local wearing of the susceptor 3, only by modifying part of the cleaning step and without a need for a new capital investment.

<Method for Producing Silicon-Containing Film and Method for Manufacturing Organic EL Display Device>

A method for producing a silicon-containing film in accordance with Embodiment 1 includes a cleaning step and a film formation step.

A method for manufacturing an organic EL display device in accordance with Embodiment 1 includes a step of forming a silicon-containing film as a sealing film on the substrate 41 having the organic EL element and others formed thereon, by using the method for producing a silicon-containing film in accordance with Embodiment 1.

The following will describe a film formation method and a cleaning method in accordance with Embodiment 1, by taking, as an example, a film formation step and a cleaning step in a process for producing a silicon-containing film through the use of the CVD apparatus 1, respectively.

<Film Formation Step>

FIG. 4 is a flowchart showing sequential steps in the process for producing a silicon-containing film in accordance with Embodiment 1.

First, the substrate 41 which is a film formation target substrate is carried into the chamber 2 and is placed on the susceptor 3 by means of a transfer mechanism such as a transfer robot (step S1). Note that in the step S1, the substrate 41 can be attracted and fixed by an electrostatic chuck.

As the substrate 41, a semiconductor substrate, such as an organic EL substrate having an organic EL element and others formed thereon, can be used. However, Embodiment 1 is not limited as such. As the substrate 41, any of various publicly known substrates conventionally used in the film formation through the use of the CVD apparatus can be used.

Subsequently, by means of the mask holder lifting mechanism 12 and the susceptor lifting mechanism 11, a distance between the shower head 4 and the film formation mask 31 is adjusted, and the substrate 41 placed on the susceptor 3 is brought into contact (close contact) with the film formation mask 31 as illustrated in (a) of FIG. 2 (step S2). Then, the susceptor 3 is heated to a predetermined temperature under control of the temperature control mechanism 8, and the chamber 2 is evacuated by the vacuum pump 18 to generate a vacuum in the chamber 2.

Thereafter, the open/close valve 14*a* provided on the film formation gas supply path 13*a* of the gas supply pipe 13 is opened to supply a film formation gas into the chamber 2 from the film formation gas supply source 15*a*. The film formation gas having been supplied into the chamber 2 is ejected in the form of a shower from the shower head 4.

A high frequency power is applied to the shower head 4 by the high frequency power source 19 so that the shower head 4 performs high frequency discharge. This makes the film formation gas into plasma. This causes the film formation gas to be chemically decomposed and proceeds reaction of the film formation gas. As a result, a silicon-containing film made up of a silicon-based compound such as $Si_3N_4$ is provided (formed) on the surface of the substrate 41 (step S3).

In this way, the silicon-containing film having a given thickness is formed on the substrate 41. Thereafter, supply of the film formation gas from the film formation gas supply source 15*a* is stopped by closing the open/close valve 14*a*, and application of a high frequency power from the high frequency power source 19 to the shower head 4 is stopped. Then, a film formation gas remaining in the chamber 2 is discharged out of the chamber 2 by the vacuum pump 18. After that, the vacuum within the chamber 2 is released so that the chamber 2 is returned to normal pressure.

Thereafter, the substrate 41 having the silicon-containing film formed on its surface is carried out of the chamber 2 through the use of the transfer mechanism such as the transfer robot (step S4).

<Cleaning Step>

As described earlier, in the film formation step, the reaction product 32 is deposited not only on the surface of the substrate 41 but also on the inner wall of the chamber and on the film formation mask 31 and other jigs within the chamber 2. Particularly, the deposition of the reaction product 32 on the film formation mask 31 can become a cause of defects in the film formation step, such as a decrease in precision of film formation and intrusion of a foreign matter into the substrate 41 due to peeling of the deposit.

In view of this, in Embodiment 1, the number of times film formation has been carried out with use of one and the same film formation mask 31 is measured, and when the number of times film formation has been carried out reaches a predetermined number of times (one or more times) (step S5), the cleaning step is performed (step S6). Note that the cleaning step can be performed when the number of times film formation has been carried out reaches the predetermined number of times (N times; N≥1) as described above. Alternatively, the cleaning step can be performed when a thickness of a deposit (silicon-based compound) deposited on the film formation mask 31 reaches a predetermined thickness. In so doing, switching between the film formation step and the cleaning step can be performed automatically by, for example, measuring the number of times film formation has been carried out by means of a measurement section of a control section (not illustrated) and controlling the CVD apparatus 1 and the transfer mechanism such as the transfer robot so that the cleaning step is performed when the measured number of times reaches a predetermined time. Alternatively, measurement of the number of times film formation has been carried out can be performed based on an operation performed for film formation in the CVD apparatus 1 or can be replaced by measurement of the number of times the substrate 41 has been carried into or out of the chamber 2 by the transfer mechanism. As a matter of course, switching between the film formation step and the cleaning step can also be performed manually. Alternatively, the measurement of the number of times film formation has been carried out by means of the measurement section can be replaced by the measurement of a thickness of the deposit deposited on the film formation mask 31 through the use of, for example, a sensor.

Further alternatively, performing cleaning of the film formation mask 31 before each film formation enables film formation to be carried out at all times with use of a cleaned film formation mask 31. This makes it possible to form a high-quality film in which intrusion of a foreign matter is inhibited.

Especially, temperatures of the chamber 2 and the susceptor 3 are controlled so that an intended process is performed at the time of film formation. In a case where the substrate 41 is an EL substrate (that is, in a case of production of an organic EL display device), the temperatures of the chamber 2 and the susceptor 3 are controlled so as to be low temperatures (equal to or lower than 100° C.) in order to prevent an EL layer from being deteriorated from heat.

Thus, in the low-temperature plasma CVD at temperatures equal to or lower than 100° C., film formation under thermal energy on the surface of a substrate is encouraged weakly, and the reaction in the plasma generally predominates over the reaction on the surface of the substrate.

Therefore, the amount of particles flown from plasma onto the surface of the substrate 41 determines the thickness of a film to be formed. In other words, the low-temperature plasma CVD is greatly influenced by a shadow caused by the film formation mask 31. Thus, alternately repeating the film formation step and the cleaning step eliminates an influence of a shadow caused by an accumulation on the film formation mask 31. This makes it possible to achieve high-definition film formation.

FIG. 5 is a flowchart showing the cleaning step in the process for producing a silicon-containing film in accordance with Embodiment 1.

As illustrated in FIG. 5, in the cleaning step indicated by the step S6 in FIG. 4, first, the heat dissipation substrate 20 is carried into the chamber 2 and is placed on the susceptor 3 by means of the transfer mechanism such as the transfer robot (step S11). Note that in the step S1, the substrate 41 can be attracted and fixed by an electrostatic chuck.

Subsequently, by means of the mask holder lifting mechanism 12 and the susceptor lifting mechanism 11, a distance between the shower head 4 and the film formation mask 31 is adjusted, and the heat dissipation substrate 20 placed on the susceptor 3 is brought into contact (close contact) with the film formation mask 31 as illustrated in FIG. 1 and (c) of FIG. 2 (step S12). Then, the susceptor 3 is cooled to a predetermined temperature under control of the temperature control mechanism 8, and the chamber 2 is evacuated by the vacuum pump 18 to generate a vacuum in the chamber 2.

Thereafter, the open/close valves 14*b* and 14*c* provided on the cleaning gas supply path 13*b* of the gas supply pipe 13 is opened. A cleaning gas supplied from the cleaning gas supply source 15*b* to the remote plasma generating section 16 is made into plasma by the remote plasma generating section 16 so as to be decomposed into ions or radicals, and the cleaning gas made into plasma is then supplied into the chamber 2. The cleaning gas having been made into plasma and then supplied into the chamber 2 is ejected in the form of a shower from the shower head 4 (step S13).

In step S13, fluorine radicals of the cleaning gas having been supplied into the chamber 2 is reacted with a silicon-based compound (e.g., a silicon-based compound deposited on the film formation mask 31 and others) within the chamber 2 to make the silicon-based compound into gas.

The silicon-based compound made into gas is discharged as an exhaust gas out of the chamber 2 by the vacuum pump 18.

Reaction between the fluorine radicals of the cleaning gas and the silicon-based compound deposited on the film formation mask 31 generates reaction heat. The reaction heat is transferred to the film formation mask 31. Advantageously, in Embodiment 1, the film formation mask 31 is in contact with the heat dissipation substrate 20 placed on the susceptor 3. This allows heat of the film formation mask 31 to be transferred to the susceptor 3 via the heat dissipation substrate 20 and subjected to heat exchange by the susceptor 3. As a result, the heat is removed. Accordingly, the film formation mask 31 is cooled.

After the completion of cleaning, supply of the cleaning gas into the chamber 2 is stopped by closing the open/close valves 14b and 14c. Then, a gas remaining in the chamber 2 is discharged out of the chamber 2 by the vacuum pump 18. After that, the vacuum within the chamber 2 is released so that the chamber 2 is returned to normal pressure (step S14).

Thereafter, the heat dissipation substrate 20 is carried out of the chamber 2 by means of the transfer mechanism such as the transfer robot (step S15). The heat dissipation substrate 20 is stored in a stocker during the film formation.

Embodiment 1 has described an example case where the heat dissipation substrate 20 is a laminate of the thermally conductive substrate 21 and the thermally conductive sheet 22. However, Embodiment 1 is not limited as such.

(a) and (b) of FIG. 6 are cross-sectional views respectively illustrating schematic configurations of main parts of other CVD apparatuses 1 in accordance with Embodiment 1.

The following will describe only differences from the CVD apparatus 1 illustrated in FIG. 1.

Modification Example 1

In the CVD apparatus 1 illustrated in (a) of FIG. 6, the heat dissipation substrate 20 is configured such that the thermally conductive substrate 21 has, on its surface, a fine-irregularities structure constituted by a plurality of long and narrow protrusions 21a.

The protrusions 21a are made from a material which is identical to a material of the thermally conductive substrate 21 or from a material to which the thermally conductive substrate 21 is metamorphosed (e.g., oxidized) by subjecting the surface of the thermally conductive substrate 21 to, for example, corrosion. The protrusions 21a are integral with the thermally conductive substrate 21.

The protrusions 21a are preferably formed so as to have a diameter, length (height from the surface of the thermally conductive substrate 21), and density such that the protrusions 21a are able to fit in between the irregularities 3a on the surface of the susceptor 3 to fill gaps between the irregularities 3a.

Thus, the protrusions 21a are formed so as to have, for example, a diameter and length on the order of nanometers and a density of $10^{10}$ pieces/cm$^2$.

Since the protrusions 21a have a diameter on the order of nanometers, they are flexible and deformable. Hence, the protrusions 21a have a diameter smaller than that of the irregularities 3a on the surface of the susceptor 3 and have flexibility. As such, when the heat dissipation substrate 20 and the susceptor 3 are brought into contact with each other, the protrusions 21a fit in between the irregularities 3a on the surface of the susceptor 3. This causes a significant increase in area of a part in which an intermolecular distance between (a) molecules constituting the protrusions 21a and (b) molecules constituting the susceptor 3 comes close to several angstroms (Å). This causes an intermolecular force to act between the heat dissipation substrate 20 and the susceptor 3. Consequently, the heat dissipation substrate 20 and the susceptor 3 come into close contact with each other.

As such, with the heat dissipation substrate 20 placed between the heat dissipation substrate 20 and the susceptor 3 such that the heat dissipation substrate 20 is in contact with the film formation mask 31 and the susceptor 3, it is possible to allow heat transferred from the film formation mask 31 to the thermally conductive substrate 21 to be efficiently transferred to the susceptor 3 via the protrusions 21a on the thermally conductive substrate 21. It is also possible to prevent the susceptor 3 from being locally worn out.

Examples of a method for forming the protrusions 21a on the heat dissipation substrate 20 include a method of pressing a casting mold impregnated with a liquid which can corrode or dissolve a metal against the thermally conductive substrate 21 which is made of a metal, thermal nano-imprinting, and UV nano-imprinting.

Examples of the liquid which can corrode or dissolve a metal include acidic liquids such as dilute hydrochloric acid and dilute sulfuric acid.

As the casting mold is used a casting mold made of a material which (i) is resistant to an acidic liquid and (ii) can be impregnated with such an acidic liquid. Examples of such a material include a crosslinkable resin and a crosslinkable rubber.

Modification Example 2

In the CVD apparatus 1 illustrated in (b) of FIG. 6, at the time of the cleaning indicated by the step S6 in FIG. 4, a cooling member 23, in place of the heat dissipation substrate 20, is inserted in between the susceptor 3 and the film formation mask 31 and is brought into close contact with the susceptor 3 and the film formation mask 31, so that the film formation mask 31 is cooled.

That is, the CVD apparatus 1 in accordance with the modification example 2 includes a cooling member, which is different from the susceptor 3, and includes a cooling member 23 in place of the heat dissipation substrate 20.

Examples of the cooling member include a heat exchanger and a heat dissipation substrate which incorporates a heat exchanger. A cooling mechanism of the cooling member can be, but is not particularly limited to, any of various publicly known cooling mechanisms.

In Embodiment 1, the cooling member 23 is carried in or out in place of the heat dissipation substrate 20 in the step of carrying the heat dissipation substrate 20 in (the step S11 in FIG. 5) and in the step of carrying the heat dissipation substrate 20 out (the step S15 in FIG. 5). Besides, in the step S12, a distance between (i) the film formation mask 31 and (ii) the shower head 4 and the cooling member 23 is adjusted. At this time, the cooling member 23 is placed between the heat dissipation substrate 20 and the susceptor 3 so as to be in contact with the film formation mask 31 and the susceptor 3. This makes it possible to directly cool the film formation mask 31 with use of the cooling member 23 and also makes it possible to prevent the susceptor 3 from being locally worn out.

Modification Example 3

Further, Embodiment 1 has described an example case where film formation and cleaning of the film formation mask 31 are carried out by using one and the same CVD apparatus 1. Alternatively, film formation and cleaning of the film formation mask 31 can be carried out by using separate CVD apparatuses. For example, after film formation has been carried out through the use of a thermal CVD apparatus, a film formation mask used in the film formation can be transferred to the CVD apparatus 1 by means of a transfer robot, so that cleaning of the film formation mask is carried out by the CVD apparatus 1.

That is, the CVD apparatus 1 can be a cleaning apparatus dedicated to cleaning. In a case where the CVD apparatus 1 is used as an apparatus dedicated to cleaning, the gas supply source 15 does not need to include the film formation gas supply source 15a, and the gas supply pipe 13 does not need to include the film formation gas supply path 13a.

Embodiment 2

The following will describe Embodiment 2 of the present invention with reference to (a) to (c) of FIG. 7 and FIG. 8. Note that Embodiment 2 will describe differences from Embodiment 1. The same reference numerals are given to members having functions identical to those of members described in Embodiment 1, and descriptions of such members are therefore omitted.

<Schematic Configuration of CVD Apparatus 1>

(a) of FIG. 7 is a cross-sectional view of a main part of a CVD apparatus 1 in accordance with Embodiment 2, the view illustrating a susceptor 3 and a film formation mask 31 which are vertically juxtaposed. (b) of FIG. 7 is a plan view illustrating the susceptor 3 and the film formation mask 31, both illustrated in (a) of FIG. 7, which are laterally juxtaposed, and (c) of FIG. 7 is a perspective view illustrating the susceptor 3 and the film formation mask 31, both illustrated in (a) of FIG. 7, which are vertically juxtaposed. Note that the components other than the susceptor 3 and the film formation mask 31 are not illustrated in (a) to (c) of FIG. 7.

The CVD apparatus 1 in accordance with Embodiment 2, as illustrated in (a) to (c) of FIG. 7, has the same configuration as that of the CVD apparatus 1 in accordance with Embodiment 1 except that the CVD apparatus 1 in accordance with Embodiment 2 includes a cooling gas ejection mechanism 50 which ejects a cooling gas in place of including the heat dissipation substrate 20.

Embodiment 2 ejects a cooling gas from the cooling gas ejection mechanism 50 during cleaning in place of inserting the heat dissipation substrate 20 between the susceptor 3 and the film formation mask 31 to perform heat exchange through the temperature control mechanism 8 provided on the back surface of the susceptor 3.

The cooling gas ejection mechanism 50 includes a cooling gas supply pipe 51, a cooling gas diffusion section 52, nozzles 53, a cooling gas supply source 55, and an open/close valve 56.

The cooling gas supply pipe 51 is a connection pipe which connects (i) the cooling gas diffusion section 52 provided within the susceptor 3 and (ii) the cooling gas supply source 55 provided outside the chamber 2, and functions as a cooling gas supply path from the cooling gas supply source 55 to the cooling gas diffusion section 52.

Note that the cooling gas supply source 55 can be a gas cylinder which accommodates the cooling gas or can be a gas generator which generates the cooling gas.

The cooling gas can be any gas that is in a gaseous form at a temperature not higher than room temperature and does not react with a cleaning gas. As the cooling gas, inert gases are preferably used. Among them, any of $N_2$ gas, Ar (argon) gas, and He (helium) gas is preferably used because they are easily available at low cost.

On the cooling gas supply pipe 51, the open/close valve 56 is provided to control opening and closing of the cooling gas supply pipe 51.

Examples of the open/close valve 56 include, but are not particularly limited to, an electromagnetic valve. In this case, the open/close valve 56 switches between opening and closing of the cooling gas supply pipe 51 by operating a valve body through the use of a magnetic force of an electromagnet (solenoid) in accordance with a control signal from a control section (not illustrated).

The cooling gas diffusion section 52 is configured such that a plurality of nozzles 53 which connect together the cooling gas diffusion section 52 and the surface of the susceptor 3 (i.e., the surface facing the film formation mask 31 which serves as a substrate placement surface) are coupled to each other. The nozzles 53 are provided so as to be juxtaposed at equal intervals in a pectinate manner on the cooling gas diffusion section 52.

On the surface of the susceptor 3, cooling gas ejection holes 54 which are fine holes of the nozzles 53 for blow are provided as nozzle holes. The cooling gas ejection holes 54 are provided regularly, for example, over the entire substrate placement surface of the susceptor 3 or throughout the substrate placement area of the susceptor 3.

The cooling gas diffusion section 52 ejects, toward the film formation mask 31 via the nozzles 53, a cooling gas having been supplied from the cooling gas supply pipe 51 and diffused within the cooling gas diffusion section 52.

Note that the diameter of the cooling gas ejection holes 54 and the number thereof are not particularly limited and can be determined to be any desired diameter and number. As described earlier, the susceptor 3 is, for example, grounded and used as a ground side. Thus, an area of the cooling gas ejection holes 54 does not significantly affect film formation itself.

Unfortunately, an increased total area of the entire cooling gas ejection holes 54 may affect temperature distribution. As such, the diameter of the cooling gas ejection holes 54 and the number thereof are preferably set to fall within a range which does not affect the temperature of the susceptor 3. Note, however, that since the range which does not affect the temperature of the susceptor 3 varies depending on a film formation temperature, the range is preferably set according to the film formation temperature.

Further, values of, for example, an angle of the nozzles 53 and a gas volume and gas pressure of the cooling gas are not particularly limited and can be set as appropriate according to factors such as a size of the CVD apparatus 1, cleaning conditions of the CVD apparatus 1, and the number and size of the remote plasma apparatus in the remote plasma generating section 16.

Further, a cooling gas cooling mechanism (not illustrated) which cools a cooling gas can be provided on a cooling gas supply path, specifically between the cooling gas supply source 55 and the cooling gas diffusion section 52.

The film formation step in Embodiment 2 is the same as that in Embodiment 1. Thus, the following will describe differences from the cleaning step in Embodiment 1.

<Cleaning Step>

FIG. 8 is a cross-sectional view illustrating a schematic configuration of a main part of the CVD apparatus 1 during cleaning.

In Embodiment 2, a remote plasma scheme is used, as in Embodiment 1, to perform cleaning of the chamber 2 so that a cleaning gas made into plasma outside the chamber 2 is ejected from the shower head 4 into the chamber 2.

On the other hand, Embodiment 2 decreases the temperature of the film formation mask 31 by blowing, from the back side of the film formation mask 31, a cooling gas for cooling on regions of the film formation mask 31 which regions include at least the openings 31a.

At this time, the film formation mask 31 and the susceptor 3 are spaced away from each other so as not to be in contact with each other. This allows the cooling gas for cooling to be radially blown from the cooling gas ejection holes 54 to the film formation mask 31, as illustrated in FIG. 8.

Note that values of, for example, a distance between the electrodes and a gas volume and pressure of the cooling gas at this time can be set as appropriate according to factors such as a size of the apparatus, cleaning conditions of the apparatus, and the number and size of the remote plasma apparatus in the remote plasma generating section 16.

Note, however, that the distance between the electrodes at this time is preferably set such that a distance (d1) between the shower head 4 and the film formation mask 31 and a distance (d2) between the susceptor 3 and the film formation mask 31 satisfy d1≤d2 as illustrated in FIG. 8.

Setting the distance between the electrodes as described above may increase a flow rate of the cooling gas. However, the increased flow rate of the cooling gas is less likely to cause lateral spread of the cooling gas having passed through the openings 31a of the film formation mask 31. Thus, it is possible to sufficiently supply the cleaning gas to the vicinity of the openings 31a of the film formation mask 31.

<Effects>

In Embodiment 2, the non-opening regions 31b and peripheral walls of the openings 31a in the film formation mask 31 are cooled by blowing the cooling gas, as illustrated in FIG. 8. Further, the cooling gas prevents entry of the cleaning gas into the openings 31a of the film formation mask 31.

Thus, in Embodiment 2 as well, the temperature of the film formation mask 31 during the cleaning can be decreased as in Embodiment 1 to prevent deformation of the film formation mask 31 (particularly, deformation of the openings 31a). Further, it is possible to prevent the cleaning gas from being blown on one or more regions of the susceptor 3 which is/are located at a position(s) corresponding to the one or more openings 31a of the film formation mask 31 in a plan view. This makes it possible to prevent the film formation mask 31 from being locally worn out and prevent damage to the susceptor 3.

Moreover, since the susceptor 3 is originally connected to the outside, wiring and piping for ejecting the cooling gas can easily be installed by providing some components of the cooling gas ejection mechanism 50 (i.e., the cooling gas supply pipe 51, the cooling gas diffusion section 52, and the nozzles 53) onto the susceptor 3 as described earlier.

Further, Embodiment 2 eliminates the need to carry a cooling member for cooling the film formation mask 31 into the chamber from outside. This makes it possible to shorten a tact time and achieve an increased cleaning efficiency and an increased productivity (manufacturing efficiency) in manufacturing a semiconductor device, such as an organic EL display device, which is made by forming the reaction product 32 into a film on the substrate 41.

Modification Example

Further, Embodiment 2 has described an example case where the cooling gas ejection holes 54 are provided on the surface of the susceptor 3. However, Embodiment 2 is not limited as such.

For example, as presented in Modification example 2 of Embodiment 1, a cooling member (cooling member 23) provided attachably and detachably can be placed on the susceptor 3 so as to be spaced away from the film formation mask 31 and have, on its surface, the cooling gas ejection holes 54.

More specifically, at the time of cleaning, the cooling member including some components of the cooling gas ejection mechanism 50 (i.e., the cooling gas supply pipe 51, the cooling gas diffusion section 52, and the nozzles 53), which is the same as that provided in the susceptor 3, can be carried into the chamber 2 and placed on the susceptor 3, so that the film formation mask 31 can be cooled by a cooling gas.

Embodiment 3

The following will describe Embodiment 3 of the present invention with reference to (a) and (b) of FIG. 9. Note that Embodiment 3 will describe differences from Embodiment 2. The same reference numerals are given to members having functions identical to those of members described in Embodiments 1 and 2, and descriptions of such members are therefore omitted.

<Schematic Configuration of CVD Apparatus 1>

(a) of FIG. 9 is a cross-sectional view of a main part of a CVD apparatus 1 in accordance with Embodiment 3, the view illustrating a susceptor 3, a shielding mask 61, and a film formation mask 31 which are vertically juxtaposed, and (b) of FIG. 9 is a perspective view illustrating the susceptor 3, the shielding mask 61, and the film formation mask 31, all illustrated in (a) of FIG. 9, which are vertically juxtaposed. Note that the components other than the susceptor 3, the shielding mask 61, and the film formation mask 31 are not illustrated in (a) and (b) of FIG. 9.

The CVD apparatus 1 in accordance with Embodiment 3, as illustrated in (a) and (b) of FIG. 9, has the same configuration as that of the CVD apparatus 1 in accordance with Embodiment 2 except that the CVD apparatus 1 in accordance with Embodiment 3 includes the shielding mask 61.

The shielding mask 61, which is provided attachably and detachably, is placed on the susceptor 3 at the time of cleaning.

The shielding mask 61 is a cooling gas ejection holes-shielding mask which closes unnecessary cooling gas ejection holes 54. The shielding mask 61, which is constituted by a plate member having a size equal to or larger than the size of the film formation mask 31, has one or more openings 61a at the same position(s) as the one or more openings 31a of the film formation mask 31. Here, the same position(s) indicate that when the shielding mask 61 is placed within the chamber 2, a center point of a corresponding one of the openings 31a of the film formation mask 31 and a center point of a corresponding one of the openings 61a of the shielding mask 61 are coaxially positioned in a direction normal to the film formation mask 31 and the shielding mask 61.

Note that the openings 61*a* of the shielding mask 61 have at least the same size as the openings 31*a* of the film formation mask 31. Therefore, for example, the openings 61*a* of the shielding mask 61 can coincide with the openings 31*a* of the film formation mask 31 with no misalignment between the openings 61*a* and the openings 31*a* in a plan view or can be formed another notch larger in a plan view.

A material of the shielding mask 61 can be any material which is not altered by a cleaning gas or a cooling gas. The shielding mask 61 can be formed of, for example, the same material as any of materials of the various jigs within the chamber 2.

The film formation step in Embodiment 3 is the same as those in Embodiments 1 and 2. The following will describe differences from the cleaning step in Embodiment 2.

<Cleaning Step>

In Embodiment 3, the shielding mask 61 is inserted between the susceptor 3 and the film formation mask 31 at the time of cleaning. The shielding mask 61 is placed on the susceptor 3 with the openings 61*a* aligned with the openings 31*a* of the film formation mask 31 so as to coincide with the openings 31*a* in a plan view.

Thus, Embodiment 3 closes cooling gas ejection holes 54 which overlap the region(s) (non-opening region(s) 61*b*) other than the one or more openings 61*a* of the shielding mask 61. Meanwhile, the shielding mask 61 and the film formation mask 31 are spaced away from each other so as not to be in contact with each other. This allows the cooling gas for cooling to be radially blown from the cooling gas ejection holes 54 to the film formation mask 31, as illustrated in FIG. 8. Consequently, in Embodiment 3, a cooling gas is ejected according to an opening pattern of the film formation mask 31.

Note that the shielding mask 61 is prepared for each opening pattern of the film formation mask 31. Every time the film formation mask 31 is changed, the shielding mask 61 is replaced with another.

Further, at the time of film formation, the shielding mask 61 is carried out of the chamber 2 by a transfer robot and is then stored in a stocker.

<Effects>

In Embodiment 3, at the time of cleaning, unnecessary cooling gas ejection holes 54 are closed by the shielding mask 61 having one or more openings at the same position (s) as the opening(s) of the film formation mask 31, as described earlier. This changes a combination of cooling gas ejection holes 54 through which the cooling gas is to be ejected, according to the shape of the openings 31*a* of the film formation mask 31.

In Embodiment 3 as well, the cooling gas can cool the film formation mask 31, and the cooling gas prevents entry of the cleaning gas into the openings 31*a*. Thus, it is possible to obtain the effect similar to that obtained in Embodiment 2.

Further, Embodiment 3 limits ejection of the cooling gas according to the shape of the openings 31*a* of the film formation mask 31. This makes it possible to perform cleaning at lower cost.

Moreover, Embodiment 3 limits the cooling gas ejection holes 54 through which the cooling gas is to be ejected. This allows the flow rate of the cooling gas which passes through the openings 31*a* of the film formation mask 31 to be increased even in a case where the gas volume and gas pressure of the cooling gas are decreased in comparison with the case where the cooling gas is blown throughout the film formation mask 31. Thus, it is possible to inhibit lateral spread of the cooling gas having passed through the openings 31*a* of the film formation mask 31, and it is possible to prevent entry of the cleaning gas into the openings 31*a* and to sufficiently supply the cleaning gas to the vicinity of the openings 31*a* of the film formation mask 31.

The shielding mask 61, which does not necessitate wiring and piping, can easily be carried in and arranged from outside automatically by means of, for example, a substrate transfer robot or the like. This makes it possible to change, with an inexpensive and simple configuration, a combination of cooling gas ejection holes 54 through which the cooling gas is to be ejected.

Embodiment 4

The following will describe Embodiment 4 of the present invention with reference to (a) and (b) of FIG. 10. Note that Embodiment 4 will describe differences from Embodiments 2 and 3. The same reference numerals are given to members having functions identical to those of members described in Embodiments 1 to 3, and descriptions of such members are therefore omitted.

<Schematic Configuration of CVD Apparatus 1>

(a) of FIG. 10 is a cross-sectional view of a main part of a CVD apparatus 1 in accordance with Embodiment 4, the view illustrating a susceptor 3 and a film formation mask 31 which are vertically juxtaposed, and (b) of FIG. 10 is a cross-sectional view illustrating a region A, which is indicated by a dot-and-dash line in (a) of FIG. 10, in an enlarged view. Note that the components other than the susceptor 3 and the film formation mask 31 are not illustrated in (a) of FIG. 10.

In Embodiment 4, at the time of cleaning, a combination of cooling gas ejection holes 54 through which the cooling gas is to be ejected is changed according to the shape of the openings 31*a* of the film formation mask 31, as in Embodiment 3.

Note, however, that in Embodiment 4, the shutters 57 which open and close the nozzles 53, in place of the shielding mask 61, close unnecessary cooling gas ejection holes 54.

The CVD apparatus 1 in accordance with Embodiment 4, as illustrated in (a) and (b) of FIG. 10, has the same configuration as that of the CVD apparatus 1 in accordance with Embodiment 2 except that the cooling gas ejection mechanism 50 includes a plurality of shutters 57, shutter housing sections 58, and a shutter driving section 59.

Each of the shutters 57 is provided so as to be able to advance and retract with respect to a corresponding one of the nozzles 53, so that it can open and close the corresponding one of the nozzles 53. Each of the shutter housing sections 58 is provided adjacent to a corresponding one of the nozzles 53 so that it can accommodate a corresponding one of the shutters 57 while the corresponding one of the nozzles 53 is opened.

The shutters 57 are provided so as to be electrically or magnetically slidable on an individual basis by the shutter driving section 59.

The shutter driving section 59 causes any of the shutters 57 to be slid, in accordance with a control signal from a control section (not illustrated).

<Film Formation Step and Cleaning Step>

In Embodiment 4, film formation is performed in a state in which all of the shutters 57 are closed, whereas cleaning is performed in a state in which one or more of cooling gas ejection holes 54 which is/are located at a position(s)

corresponding to the one or more openings 31a of the film formation mask 31 in a plan view is/are opened, and the other cooling gas ejection holes 54 which overlap the non-opening region(s) 31b are closed by corresponding ones of the shutters 57. Except for this point, film formation and cleaning in Embodiment 4 are performed as in Embodiment 2.

<Effects>

As described above, in Embodiment 4, a combination of cooling gas ejection holes 54 through which a cooling gas is to be ejected is changed according to the shape of the openings 31a of the film formation mask 31 as in Embodiment 3. Thus, it is possible to obtain the effect similar to that obtained in Embodiment 3.

Further, in Embodiment 4, a combination of cooling gas ejection holes 54 through which a cooling gas is to be ejected is changed by means of the shutters 57 provided in the susceptor 3. This eliminates the need for a carry-in step of carrying the shielding mask 61 into the chamber 2 after film formation. Thus, Embodiment 4 has an advantage in that it can make a tact time shorter than Embodiment 3.

Embodiment 5

The following will describe Embodiment 5 of the present invention with reference to (a) and (b) of FIG. 11. Note that Embodiment 5 will describe differences from Embodiment 2. The same reference numerals are given to members having functions identical to those of members described in Embodiments 1 to 4, and descriptions of such members are therefore omitted.

<Schematic Configuration of CVD Apparatus 1>

(a) of FIG. 11 is a cross-sectional view of a main part of a CVD apparatus 1 in accordance with Embodiment 5, the view illustrating a susceptor 3 and a film formation mask 31 which are vertically juxtaposed. (b) of FIG. 11 is a plan view schematically illustrating a configuration of the susceptor 3 illustrated in (a) of FIG. 11. Note that the components other than the susceptor 3 and the film formation mask 31 are not illustrated in (a) of FIG. 11.

The CVD apparatus 1 in accordance with Embodiment 4 has the same configuration as that of the CVD apparatus 1 in accordance with Embodiment 2 except for the following points.

In Embodiment 2, the cooling gas ejection holes 54 are provided in the substrate placement area of the substrate placement surface of the susceptor 3. In contrast, a CVD apparatus 1 in accordance with Embodiment 5 is configured such that, as illustrated in (a) and (b) of FIG. 11, the cooling gas ejection holes 54 are provided in an area (i.e., a peripheral area 72 in which the substrate 41 is not placed) other than the substrate placement area 71a of the substrate placement surface of the susceptor 3.

Further, in Embodiment 2, the nozzles 53 are provided vertically to the substrate placement surface of the susceptor 3, whereas in Embodiment 5, the nozzles 53 are provided such that they are inclined at different inclination angles so that the cooling gas having been ejected through the cooling gas ejection holes 54 is blown throughout the back surface of the film formation mask 31. That is, in Embodiment 5, a plurality of nozzles 53 are provided at different inclination angles in the peripheral area 72 (peripheral edge portion) of the susceptor 3 in a plan view.

The nozzles 53 and their corresponding cooling gas ejection holes 54 have are cooling gas ejection angles which are so adjusted that the cooling gas is blown throughout the back surface of the film formation mask 31.

<Film Formation Step and Cleaning Step>

The film formation step in Embodiment 5 is performed as in Embodiment 1. Further, the cleaning step in Embodiment 5 is performed as in Embodiment 2.

Note, however, that in Embodiment 5, the cooling gas ejection holes 54 are provided only in the peripheral area 72 of the substrate placement surface of the susceptor 3. Thus, values of, for example, a distance between the susceptor 3 and the film formation mask 31 and a gas volume and pressure of the cooling gas during cleaning are so adjusted that the cooling gas having been ejected obliquely through the cooling gas ejection holes 54 are distributed throughout the back surface of the film formation mask 31.

<Effects>

In Embodiment 5, the cooling gas is blown throughout the back surface of the film formation mask 31 through the cooling gas ejection holes 54. Thus, according to Embodiment 5, as in Embodiment 2, the non-opening regions 31b and peripheral walls of the openings 31a in the film formation mask 31 are cooled by blowing the cooling gas, and the cooling gas prevents entry of the cleaning gas into the openings 31a of the film formation mask 31. Consequently, according to Embodiment 5, it is possible to obtain the effect similar to that obtained in Embodiment 2.

Further, in Embodiment 5, the cooling gas ejection holes 54 are provided only in the peripheral area 72 of the substrate placement surface of the susceptor 3. In this arrangement, the diameter of the cooling gas ejection holes 54 and the number thereof do not affect temperature distribution in the substrate placement area 71 during film formation. As such, the diameter of the cooling gas ejection holes 54 and the number thereof can be set to any values. For example, as illustrated in (b) of FIG. 11, the cooling gas ejection holes 54 can be provided at a high density. Further, since the cooling gas ejection holes 54 are not provided in the regions corresponding to the openings 31a of the film formation mask 31, it is possible to prevent damage to the cooling gas ejection holes 54 by the cleaning gas even if the cleaning gas has passed through the openings 31a.

Modification Example

Note that Embodiment 5 as well has described an example case where the cooling gas ejection holes 54 are provided on the surface of the susceptor 3. It is needless to say that in Embodiment 5 as well, a cooling member (cooling member 23) provided attachably and detachably can be placed on the susceptor 3 so as to be spaced away from the film formation mask 31 and have, on its surface, the cooling gas ejection holes 54.

[Recap]

In Embodiments 1 to 5 described above, while the film formation mask 31 having a film residue (reaction product 32) deposited thereon is cooled, cleaning of the film formation mask 31 is performed by blowing a cleaning gas made into plasma, which cleaning gas reacts with the film residue, on a surface of the film formation mask 31.

More specifically, at this time, the film residue deposited on a surface of the film formation mask 31 is made into gas and is removed.

The following will more specifically describe aspects of the present invention.

A cleaning method in accordance with a first aspect of the present invention is a cleaning method in which cleaning of a film formation mask 31, which is disposed between a first electrode (a shower head 4 serving as an upper electrode) and a second electrode (a susceptor 3 serving as a lower electrode) within a chamber 2, the first electrode having a gas ejection section (a gas diffusion room 5 having gas ejection holes 6), the second electrode disposed so as to face the first electrode, is performed by blowing a cleaning gas made into plasma, which cleaning gas reacts with a film residue (a reaction product 32) deposited on a surface of the film formation mask 31, on the film formation mask 31 from the gas ejection section, the cleaning method including: performing cleaning of the film formation mask 31 while cooling the film formation mask 31.

A cleaning method in accordance with a second aspect of the present invention can be arranged such that, in the first aspect of the present invention, the film formation mask 31 is cooled by bringing a coolant (a heat dissipation substrate 20, a cooling member 23, the susceptor 3 cooled by a temperature control mechanism 8, or a cooling gas) into contact with a back surface of the film formation mask 31.

A cleaning method in accordance with a third aspect of the present invention can be arranged such that, in the second aspect of the present invention, the coolant is a heat dissipation substrate 20, and the film formation mask 31 is cooled by cooling the second electrode in a state in which the heat dissipation substrate 20 is disposed between the film formation mask 31 and the second electrode such that the heat dissipation substrate 20 is in contact with the film formation mask 31 and the second electrode.

A cleaning method in accordance with a fourth aspect of the present invention can be arranged such that, in the third aspect of the present invention, a heat dissipation substrate 20 having, on its surface contacting the second electrode, a heat dissipation sheet (a thermally conductive sheet 22) is used as the heat dissipation substrate 20.

A cleaning method in accordance with a fifth aspect of the present invention can be arranged such that, in the third aspect of the present invention, a heat dissipation substrate 20 having, on its surface contacting the second electrode, a fine-irregularities structure constituted by protrusions 21a having a diameter on an order of nanometers is used as the heat dissipation substrate 20.

A cleaning method in accordance with a sixth aspect of the present invention can be arranged such that, in the second aspect of the present invention, the coolant is a cooling member 23 placed on the second electrode, and the film formation mask 31 is cooled by bringing the cooling member 23 into contact with the back surface of the film formation mask 31.

A cleaning method in accordance with a seventh aspect of the present invention can be arranged such that, in the second aspect of the present invention, the coolant is a cooling gas, the second electrode has a plurality of cooling gas ejection holes 54 through which the cooling gas is ejected, the second electrode and the film formation mask 31 are disposed so as to be spaced away from each other, and the film formation mask 31 is cooled by blowing the cooling gas from the second electrode on the back surface of the film formation mask 31.

A cleaning method in accordance with an eighth aspect of the present invention can be arranged such that, in the seventh aspect of the present invention, the cooling gas is blown throughout the back surface of the film formation mask 31.

A cleaning method in accordance with a ninth aspect of the present invention can be arranged such that, in the eighth aspect of the present invention, the cooling gas ejection holes 54 are provided in a peripheral edge portion (a peripheral area 72) of the second electrode, and the cooling gas is ejected at different ejection angles through the cooling gas ejection holes 54 so that the cooling gas is blown throughout the back surface of the film formation mask 31.

A cleaning method in accordance with a tenth aspect of the present invention can be arranged such that, in the seventh aspect of the present invention, one or more of the cooling gas ejection holes 54 which is/are located at a position(s) corresponding to one or more openings 31a of the film formation mask 31 in a plan view is/are opened, and the other cooling gas ejection holes 54 which overlap a non-opening region(s) 31b of the film formation mask 31 are closed.

A cleaning method in accordance with an eleventh aspect of the present invention can be arranged such that, in the tenth aspect of the present invention, the other cooling gas ejection holes 54 which overlap the non-opening regions 31b of the film formation mask 31 are closed by disposing a shielding mask 61 on a surface of the second electrode which surface faces the film formation mask 31, the shielding mask 61 having one or more openings 61a at the same position(s) as the one or more openings 31a of the film formation mask 31 in a plan view.

A cleaning method in accordance with a twelfth aspect of the present invention can be arranged such that, in the tenth aspect of the present invention, the other cooling gas ejection holes 54 which overlap the non-opening region(s) 31b of the film formation mask 31 are closed by corresponding ones of shutters 57 which are provided so as to be able to advance and retract.

A cleaning method in accordance with a thirteenth aspect of the present invention can be arranged such that, in any of the seventh to twelfth aspects of the present invention, the cooling gas is an inert gas.

A cleaning method in accordance with a fourteenth aspect of the present invention can be arranged such that, in the thirteenth aspect of the present invention, the inert gas is nitrogen gas, argon gas, or helium gas.

A cleaning method in accordance with a fifteenth aspect of the present invention can be arranged such that, in any of the first to fourteenth aspects of the present invention, the film residue is a silicon-based compound, and the cleaning gas is a fluorine-based gas.

A method for manufacturing a semiconductor device (a semiconductor device, such as an organic EL display device, which is made by forming the reaction product 32 into a film on the substrate 41) in accordance with a sixteenth aspect of the present invention can include: a film formation step of forming a film on a film formation target substrate (a substrate 41) via a film formation mask 31; and a cleaning step of performing cleaning of the film formation mask 31 by a cleaning method recited in any one of the first to fifteenth aspects.

A method for manufacturing a semiconductor device in accordance with a seventeenth aspect of the present invention can be arranged such that, in the sixteenth aspect of the present invention, the cleaning step is performed after the film formation step using the film formation mask 31 which is one and the same film formation mask has been performed at a predetermined number of times.

A method for manufacturing a semiconductor device in accordance with an eighteenth aspect of the present invention can be arranged such that, in the sixteenth aspect of the present invention, the cleaning step is performed before the film formation step is performed.

A plasma treatment apparatus (a CVD apparatus 1) in accordance with a nineteenth aspect of the present invention is a plasma treatment apparatus including: a chamber 2 which accommodates a film formation mask 31; a first electrode (a shower head 4 serving as an upper electrode), provided within the chamber 2, having a gas ejection section (a gas diffusion room 5 having gas ejection holes 6); and a second electrode (a susceptor 3 serving as a lower electrode), provided within the chamber 2, disposed so as to face the first electrode via the film formation mask 31, wherein a cleaning gas made into plasma, which cleaning gas reacts with a film residue (a reaction product 32) deposited on a surface of the film formation mask 31, is ejected from the gas ejection section so that the film residue deposited on the surface of the film formation mask 31 is made into gas and is removed, the plasma treatment apparatus including: a cooling member (the heat dissipation substrate 20, the cooling member 23, a cooling gas ejection mechanism 50, or the temperature control mechanism 8 which cools the film formation mask 31 via the susceptor 3) which cools the film formation mask 31 during cleaning.

A plasma treatment apparatus (a CVD apparatus 1) in accordance with a twentieth aspect of the present invention can be arranged such that, in the nineteenth aspect of the present invention, the cooling member is placed on a back surface side of the film formation mask 31, and the film formation mask 31 is cooled from the back surface side of the film formation mask 31.

A plasma treatment apparatus (a CVD apparatus 1) in accordance with a twenty-first aspect of the present invention can be arranged such that, in the nineteenth or twentieth aspect of the present invention, the cooling member is a heat dissipation substrate 20 which is disposed between the film formation mask 31 and the second electrode such that the heat dissipation substrate 20 is in contact with the film formation mask 31 and the second electrode, and the second electrode is provided with a temperature control mechanism 8 which cools the second electrode during cleaning.

A plasma treatment apparatus (a CVD apparatus 1) in accordance with a twenty-second aspect of the present invention can be arranged such that, in the twenty-first aspect of the present invention, the heat dissipation substrate 20 has, on its surface contacting the second electrode, a heat dissipation sheet (thermally conductive sheet 22).

A plasma treatment apparatus (a CVD apparatus 1) in accordance with a twenty-third aspect of the present invention can be arranged such that, in the twenty-second aspect of the present invention, the heat dissipation substrate 20 has, on its surface contacting the second electrode, a fine-irregularities structure constituted by protrusions 21*a* having a diameter on an order of nanometers.

A plasma treatment apparatus (a CVD apparatus 1) in accordance with a twenty-fourth aspect of the present invention can be arranged such that, in the nineteenth or twentieth aspect of the present invention, the cooling member 23 is placed on the second electrode so as to contact a back surface of the film formation mask 31.

A plasma treatment apparatus (a CVD apparatus 1) in accordance with a twenty-fifth aspect of the present invention can be arranged such that, in the nineteenth or twentieth aspect of the present invention, the cooling member is a cooling gas ejection mechanism 50 which blows a cooling gas on a back surface of the film formation mask 31, and the second electrode has a plurality of cooling gas ejection holes 54 through which the cooling gas is ejected.

A plasma, treatment apparatus (a CVD apparatus 1) in accordance with a twenty-sixth aspect of the present invention can be arranged such that, in the twenty-fifth aspect of the present invention, the cooling gas ejection holes 54 are provided over an entire surface of the second electrode which surface faces the film formation mask 31.

A plasma treatment apparatus (a CVD apparatus 1) in accordance with a twenty-seventh aspect of the present invention can be arranged, in the twenty-sixth aspect of the present invention, to further include a shielding mask 61, provided between the film formation mask 31 and the second electrode, having one or more openings 61*a* at the same position(s) as one or more openings 31*a* of the film formation mask 31 in a plan view, the shielding mask 61 being placed in contact with the second electrode to close some of the cooling gas ejection holes 54 which overlap a non-opening region(s) 31*b* of the film formation mask 31.

A plasma treatment apparatus (a CVD apparatus 1) in accordance with a twenty-eighth aspect of the present invention can be arranged, in the twenty-sixth aspect of the present invention, to further include shutters 57, provided so as to be able to advance and retract, which close some of the cooling gas ejection holes 54 which overlap a non-opening region(s) 31*b* of the film formation mask 31.

A plasma treatment apparatus (a CVD apparatus 1) in accordance with a twenty-ninth aspect of the present invention can be arranged such that, in the twenty-fifth aspect of the present invention, the cooling gas ejection mechanism 50 has, in a peripheral edge portion (a peripheral area 72) of the second electrode in a plan view, a plurality of nozzles 53 having the cooling gas ejection holes 54 and having different inclination angles.

A plasma treatment apparatus (a CVD apparatus 1) in accordance with a thirtieth aspect of the present invention can be arranged such that, in any of the twenty-fifth to twenty-ninth aspects of the present invention, the cooling gas is an inert gas.

A plasma treatment apparatus (a CVD apparatus 1) in accordance with a thirty-first aspect of the present invention can be arranged such that, in the thirtieth aspect of the present invention, the inert gas is nitrogen gas, argon gas, or helium gas.

A plasma treatment apparatus (a CVD apparatus 1) in accordance with a thirty-second aspect of the present invention can be arranged such that, in any of the nineteenth to thirty-first aspects of the present invention, the film residue is a silicon-based compound, and the cleaning gas is a fluorine-based gas.

A plasma treatment apparatus (a CVD apparatus 1) in accordance with a thirty-third aspect of the present invention can be arranged such that, in any of the nineteenth to thirty-second aspects of the present invention, the plasma treatment apparatus serves as a film formation apparatus and a cleaning apparatus, and during film formation, a film formation gas from the gas ejection section is blown via the film formation mask 31 on the substrate 41 placed on the second electrode.

A plasma treatment apparatus (a CVD apparatus 1) in accordance with a thirty-fourth aspect of the present invention can be arranged such that, in any of the nineteenth to thirty-second aspects of the present invention, the plasma treatment apparatus is a cleaning apparatus dedicated to cleaning.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The present invention is applicable to: a method of cleaning a film formation mask used for manufacture of a semiconductor device such as an organic EL device; a semiconductor device manufacturing method using the cleaning method; and a plasma treatment apparatus used for cleaning of the film formation mask.

REFERENCE SIGNS LIST

1: CVD apparatus
2: Chamber
2a: Gas supply port
2b: Exhaust port
3: Susceptor (second electrode; coolant)
3a: Irregularity
4: Shower head (first electrode)
5: Gas diffusion room (gas ejection section)
6: Gas ejection hole
7: Mask holder
8: Temperature control mechanism (cooling member)
9: Temperature control mechanism driving section
11: Susceptor lifting mechanism
12: Mask holder lifting mechanism
13: Gas supply pipe
13a: Film formation gas supply path
13b: Cleaning gas supply path
14a to 14c: Open/close valve
15: Gas supply source
15a: Film formation gas supply source
15b: Cleaning gas supply source
16: Remote plasma generating section
17: Exhaust pipe
18: Vacuum pump
19: High frequency power source
20: Heat dissipation substrate (cooling member; coolant)
21: Thermally conductive substrate
21a: Protrusion
22: Thermally conductive sheet (heat dissipation sheet)
23: Cooling member (coolant)
31: Opening
31: Film formation mask
31a: Opening
31b: Non-opening region
32: Reaction product (film derived from a source material gas which is contained in a film formation gas; film residue)
41: Substrate (film formation target substrate)
50: Cooling gas ejection mechanism (cooling member)
51: Cooling gas supply pipe
52: Cooling gas diffusion section
53: Nozzle
54: Cooling gas ejection hole
55: Cooling gas supply source
56: Open/close valve
57: Shutter
58: Shutter housing section
59: Shutter driving section
61: Shielding mask
61a: Opening
61b: Non-opening region
71: Substrate placement area
72: Peripheral area (peripheral edge portion)

What is claimed is:

1. A cleaning method in which cleaning of a film formation mask, which is disposed between a first electrode and a second electrode within a chamber, the first electrode having a gas ejection section, the second electrode disposed so as to face the first electrode, is performed by blowing a cleaning gas made into plasma, which cleaning gas reacts with a film residue deposited on a surface of the film formation mask, on the film formation mask from the gas ejection section,
the cleaning method comprising:
performing cleaning of the film formation mask while cooling the film formation mask;
wherein the film formation mask is cooled by bringing a coolant into contact with a back surface of the film formation mask;
wherein the coolant is a cooling gas, the second electrode has a plurality of cooling gas ejection holes through which the cooling gas is ejected, the second electrode and the film formation mask are disposed so as to be spaced away from each other, and the film formation mask is cooled by blowing the cooling gas on the back surface of the film formation mask from the second electrode; and
wherein one or more of the cooling gas election holes which is/are located at a position(s) corresponding to one or more openings of the film formation mask in a plan view is/are opened, and the other cooling gas ejection holes which overlap a non-opening region(s) of the film formation mask are closed.

2. The cleaning method according to claim 1, wherein the other cooling gas election holes which overlap the non-opening regions of the film formation mask are closed by disposing a shielding mask on a surface of the second electrode which surface faces the film formation mask, the shielding mask having one or more openings at the same position(s) as the one or more openings of the film formation mask in a plan view.

3. The cleaning method according to claim 1, wherein the other cooling gas ejection holes which overlap the note-opening region(s) of the film formation mask are closed by corresponding ones of shutters which are provided so as to be able to advance and retract.

4. The cleaning method according to claim 1, wherein the cooling gas is an inert gas.

5. The cleaning method according to claim 1, wherein the film residue is a silicon-based compound, and the cleaning gas is a fluorine-based gas.

* * * * *